(12) United States Patent
Raza et al.

(10) Patent No.: US 9,973,301 B2
(45) Date of Patent: May 15, 2018

(54) MEMORY MANAGEMENT AND PATH SORT TECHNIQUES IN A POLAR CODE SUCCESSIVE CANCELLATION LIST DECODER

(71) Applicant: COHERENT LOGIX, INCORPORATED, Austin, TX (US)

(72) Inventors: Zahir Raza, Waterloo (CA); Kevin A. Shelby, Austin, TX (US)

(73) Assignee: Coherent Logix, Incorporated, Austin, TX (US)

( * ) Notice: Subject to any disclaimer, the term of this patent is extended or adjusted under 35 U.S.C. 154(b) by 0 days. days.

(21) Appl. No.: 15/359,845

(22) Filed: Nov. 23, 2016

(65) Prior Publication Data
US 2017/0149531 A1 May 25, 2017

Related U.S. Application Data

(60) Provisional application No. 62/259,385, filed on Nov. 24, 2015, provisional application No. 62/269,744,
(Continued)

(51) Int. Cl.
*H03M 13/00* (2006.01)
*H04L 1/00* (2006.01)
*G06F 11/10* (2006.01)
*H03M 13/13* (2006.01)
*H03M 13/37* (2006.01)

(52) U.S. Cl.
CPC ............ *H04L 1/0045* (2013.01); *G06F 11/10* (2013.01); *H03M 13/13* (2013.01); *H03M 13/37* (2013.01); *H04L 1/0058* (2013.01)

(58) Field of Classification Search
CPC ...... H04L 1/0058; G06F 11/10; H03M 13/13; H03M 13/37
See application file for complete search history.

(56) References Cited

U.S. PATENT DOCUMENTS 8,347,186 B1 * 1/2013 Arikan ................. H03M 13/13
714/774
8,880,866 B2 11/2014 Doerr
(Continued)

OTHER PUBLICATIONS

E Arikan, "Channel Polarization: A Method for Constructing Capacity-Achieving Codes for Symmetric Binary-Input Memoryless Channels," IEEE Trans. on Inf. Theory, vol. 55, No. 7, pp. 3051-3073, Jul. 2009 (23 pages).
(Continued)

*Primary Examiner* — Christine T. Tu
(74) *Attorney, Agent, or Firm* — Meyertons Hood Kivlin Kowert & Goetzel, P.C.; Jeffrey C. Hood

(57) ABSTRACT

Various embodiments are described of a system and method for improved SCL decoder operation. In particular, various embodiments are described which improve the efficiency of the buffer management based on updated path metric statistics. In some embodiments, the SCL decoder may perform selective replacement to limit the extent of LLR updates per row only to the statistics that have changed since the previous update cycle. In some embodiments, the SCL decoder may perform deferred updates, which may involves in-place calculation of both $\hat{u}_\varphi=0$ and $\hat{u}_\varphi=1$ bit estimate (LLR) updates based on the row from which the updated row will be derived.

22 Claims, 15 Drawing Sheets

Related U.S. Application Data filed on Dec. 18, 2015, provisional application No. 62/277,569, filed on Jan. 12, 2016.

(56) References Cited

U.S. PATENT DOCUMENTS

2017/0187396 A1* 6/2017 Jeong ............... H03M 13/2915
2017/0324514 A1* 11/2017 Shen ..................... H04L 1/0058

OTHER PUBLICATIONS

I. Tal and A. Vardy, "List Decoding of Polar codes," IEEE Trans. Inf. Theory, vol. 61, No. 5, pp. 2213-2226, May 2015 (14 pages).

B. Li, et al, "An Adaptive Successive Cancellation List Decoder for Polar Codes with Cyclic Redundancy Check," IEEE communications Letter, vol. 16, No. 12, pp. 2044-2047, Dec. 2012 (4 pages).

Sarkis, et al., "Fast Polar Decoders: Algorithm and Implementation," IEEE JSAC, vol. 32, No. 5, pp. 946-957, May 2014 (12 pages).

A. Alamdar-Yazdi and F. R. Kschischang, "A Simplified Successive-Cancellation Decoder for Polar Codes," IEEE Communications Letters, vol. 15, No. 12, pp. 1378-1380, Dec. 2011 (3 pages).

A. Balatsoukas-Stimming, M. B. Parizi, and A. Burg, "LLR-Based Successive Cancellation List Decoding of Polar Codes," in IEEE Transactions on Signal Processing, vol. 63, No. 19, pp. 5165-5179, Oct. 1, 2015 (15 pages).

* cited by examiner

MEMORY MANAGEMENT AND PATH SORT TECHNIQUES IN A POLAR CODE SUCCESSIVE CANCELLATION LIST DECODER

PRIORITY CLAIM

This application claims benefit of priority to Application No. 62/259,385 titled "Memory Management in a Polar Code Successive Cancellation List Decoder", filed on Nov. 24, 2015; Application No. 62/269,744, titled "Memory Management and Path Sort Techniques in a Polar Code Successive Cancellation List Decoder", filed on Dec. 18, 2015; and Application No. 62/277,569, titled "Memory Management and Path Sort Techniques in a Polar Code Successive Cancellation List Decoder", filed on Jan. 12, 2016; and which are hereby incorporated by reference as though fully and completely set forth herein.

FIELD OF THE INVENTION

The field of the invention generally relates to decoders used in communications.

DESCRIPTION OF THE RELATED ART

Decoders are used in many areas of communications. One example of a decoder used in communications applications is a Forward Error Correction (FEC) decoder. Data movement and data storage are key considerations in determining an efficient mapping of a Forward Error Correction (FEC) decoder to a given processor architecture. The current design of a Polar Code decoder involves extension of a Successive Cancellation (SC) decoder. For more information on an example of the current design of a Polar Code decoder, please see reference 1, below. While yielding low decoding complexity, the SC decoder requires long block sizes ($N=2^n$, approaching a million bits (i.e. n=20), in order to rival Turbo or Low Density Parity Check (LDPC) Codes in terms of bit error performance.

A Successive Cancellation List (SCL) Decoder is an extension of the SC decoder. The SCL Decoder may improve bit error performance for realizable block lengths, e.g. $N=2^{11}$. SCL decoding may consider two possibilities in parallel: $\hat{u}_\varphi=0$ and $\hat{u}_\varphi=1$, at each phase of the SC decoder loop. The result is a decoder tree, the dimension of which doubles with each decoded information bit. To manage complexity, current implementations of the SCL decoder may prune the list at each decoding stage to fixed list size, L, based on accumulated path metrics along each branch of the tree. Please see reference 2 below for a detailed discussion and early implementation of these ideas.

The exchange of data between processor stages is important for proper SCL decoder operation, and data exchange may introduce significant latency into the SCL decoder operation. Accordingly, improvements in the field are desired.

SUMMARY OF THE EMBODIMENTS

Various embodiments are described of a system and method for improved SCL decoder operation. In particular, various embodiments are described which improve the efficiency of the buffer management based on updated path metric statistics. A commonly used path metric statistic is a log likelihood ratio (LLR), defined below, that is dependent upon bit position, the estimated information vector, newly received symbol for the bit position, and previously decoded bits. LLR metrics produce greater numerical stability than other metrics, as explained in reference 4 below.

In a first embodiment, the SCL decoder may perform selective replacement. Conventional decoder implementation may update entire rows in the buffer based on path metrics calculated from the preceding round of bit estimate (e.g., LLR) updates. Selective replacement limits the extent of LLR updates per row only to the statistics that have changed since the previous update cycle.

In a second embodiment, the SCL decoder may perform deferred updates. A conventional decoder may update path metrics, sort, and then replace rows of the statistics buffers as needed prior to the next stage of LLR updates. This sequence of operations is denoted as Input Copy given that the input to each row is copied to a predetermined buffer location before LLR update processing can resume. According to the new approach described herein, termed Results Multicast, in some embodiments the method instead involves in-place calculation of both $\hat{u}_\varphi=0$ and $\hat{u}_\varphi=1$ bit estimate (LLR) updates based on the row from which the updated row is derived. Rather than copy input statistics, the output statistics may be computed in-place and then forwarded in a deferred multicast to the in-place buffer as well as to any additional destination buffers, simultaneously.

BRIEF DESCRIPTION OF THE DRAWINGS

A better understanding of the present invention can be obtained when the following detailed description of the preferred embodiment is considered in conjunction with the following drawings, in which.

Figure 1:
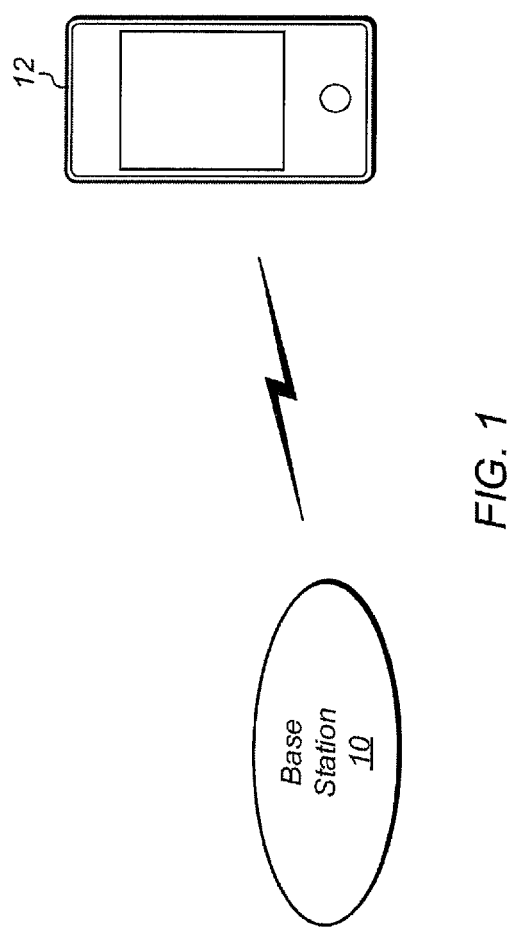
FIG. 1 illustrates an example wireless communication system.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS OF THE INVENTION

Incorporation by Reference

The following references are hereby incorporated by reference in their entirety as though fully and completely set forth herein:

1. E. Arikan, "Channel Polarization: A method for constructing capacity achieving codes for symmetric binary-input memoryless channels," *IEEE Trans. on Inf. Theory*, vol. 55, no. 7, pp. 3051-3073, Jul. 2009.
2. I. Tal and A. Vardy, "List Decoding of Polar Codes," IEEE Trans. on Information Theory, vol. 61, no. 5, pp. 2213-2226, May 2015.
3. G. Sarkis, P. Giard, A. Vardy, C. Thibeault and W. J. Gross, "Fast Polar Decoders: Algorithm and Implementation," IEEE J. on Selected Areas in Communications, vol. 32, no. 5, pp. 946-957, May 2014.
4. A. Balatsoukas-Stimming, M. B. Parizi and A. Burg, "LLR-Based Successive Cancellation List Decoding of Polar Codes," in IEEE Transactions on Signal Processing, vol. 63, no. 19, pp. 5165-5179, October, 2015

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, optical storage, or ROM, EPROM, FLASH, etc. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical or optical signals.

Programmable Hardware Element—includes various hardware devices comprising multiple programmable function blocks connected via a programmable or hardwired interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Application Specific Integrated Circuit (ASIC)—this term is intended to have the full breadth of its ordinary meaning. The term ASIC is intended to include an integrated circuit customized for a particular application, rather than a general purpose programmable device, although ASIC may contain programmable processor cores as building blocks. Cell phone cell, MP3 player chip, and many other single-function ICs are examples of ASICs. An ASIC is usually described in a hardware description language such as Verilog or VHDL.

Program—the term "program" is intended to have the full breadth of its ordinary meaning. The term "program" includes 1) a software program which may be stored in a memory and is executable by a processor or 2) a hardware configuration program useable for configuring a programmable hardware element or ASIC.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, e.g., imperative or procedural languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element or ASIC.

Computer System—any of various types of computing or processing systems, including a personal computer system (PC), mainframe computer system, workstation, network appliance, Internet appliance, personal digital assistant (PDA), grid computing system, or other device or combinations of devices. In general, the term "computer system" can be broadly defined to encompass any device (or combination of devices) having at least one processor that executes instructions from a memory medium.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

System Overview

FIG. 1 shows an example communication system involving a base station 10 communicating with a wireless communication device 12. The base station 10 may be a cellular base station which performs cellular communications with a plurality of wireless communication devices. Alternatively, the base station 10 may be a wireless access point for performing Wi-Fi communications, such as according to the 802.11 standard or related standards. The wireless communication device 12 may be any of various devices such as a smart phone, tablet device, computer system, etc. One or both of the base station 10 and the wireless communication device 12 may include decoder logic as described herein.

Figure 2:
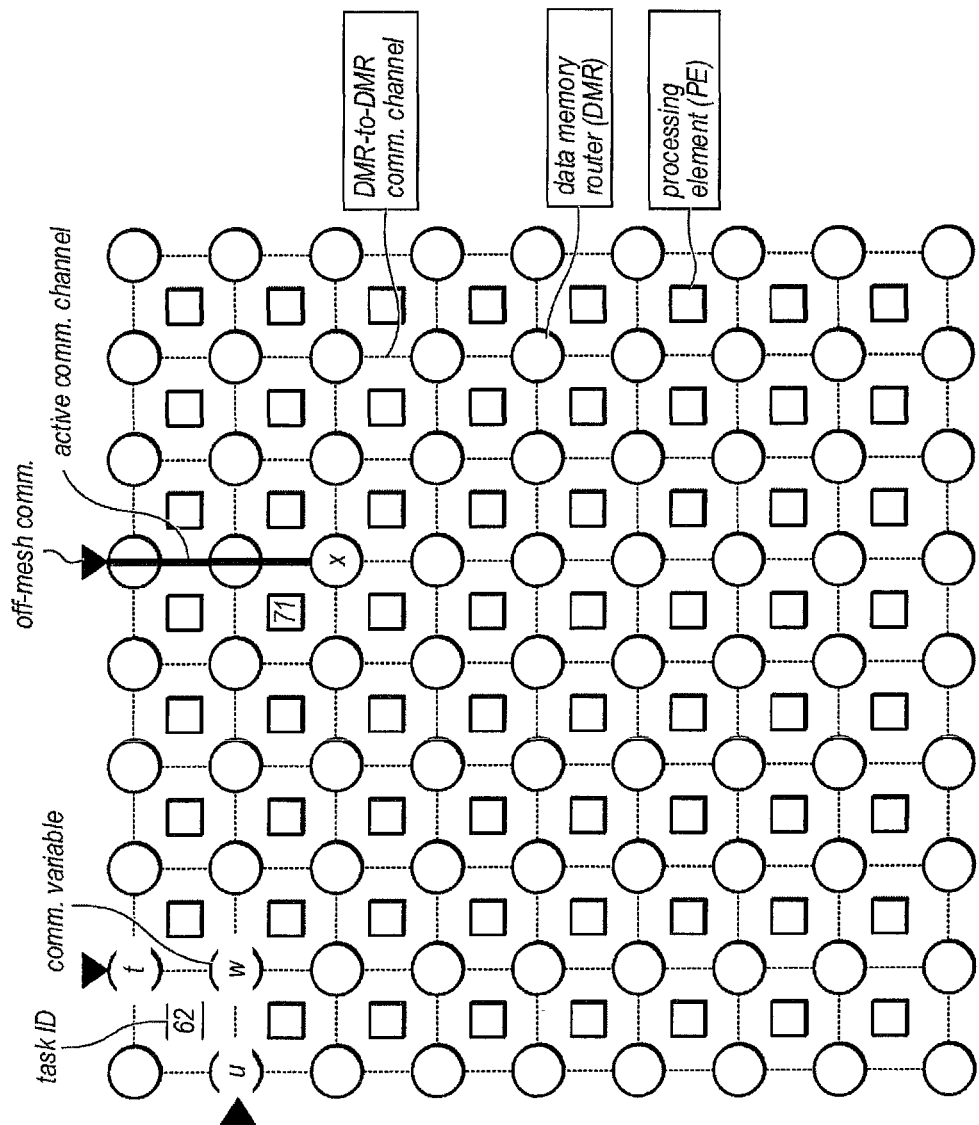
FIG. 2 illustrates an example processor system in a decoder of a device.

FIG. 2 illustrates an example processor system that may be present in a decoder, wherein the decoder may be contained in one or both of the base station 10 and/or the wireless communication device 12. In this example, the processor system may comprise a plurality of interspersed processors and memories, as shown where the rectangles are processing elements (also called functional units) and the circles are memories, also referred to as data memory routers. The processor system may be programmed to implement the methods described herein. For more information on an example processor system architecture which may be used in some embodiments, please see U.S. Pat. Nos. 7,415,594 and 8,880,866, which are hereby incorporated by reference in their entirety as though fully and completely set forth herein. Another example of a processor system is a programmable hardware element (PHE) as defined above. For example, the decoder may include a PHE, such as an FPGA, which may be configured to implement the methods described herein.

Figure 3:
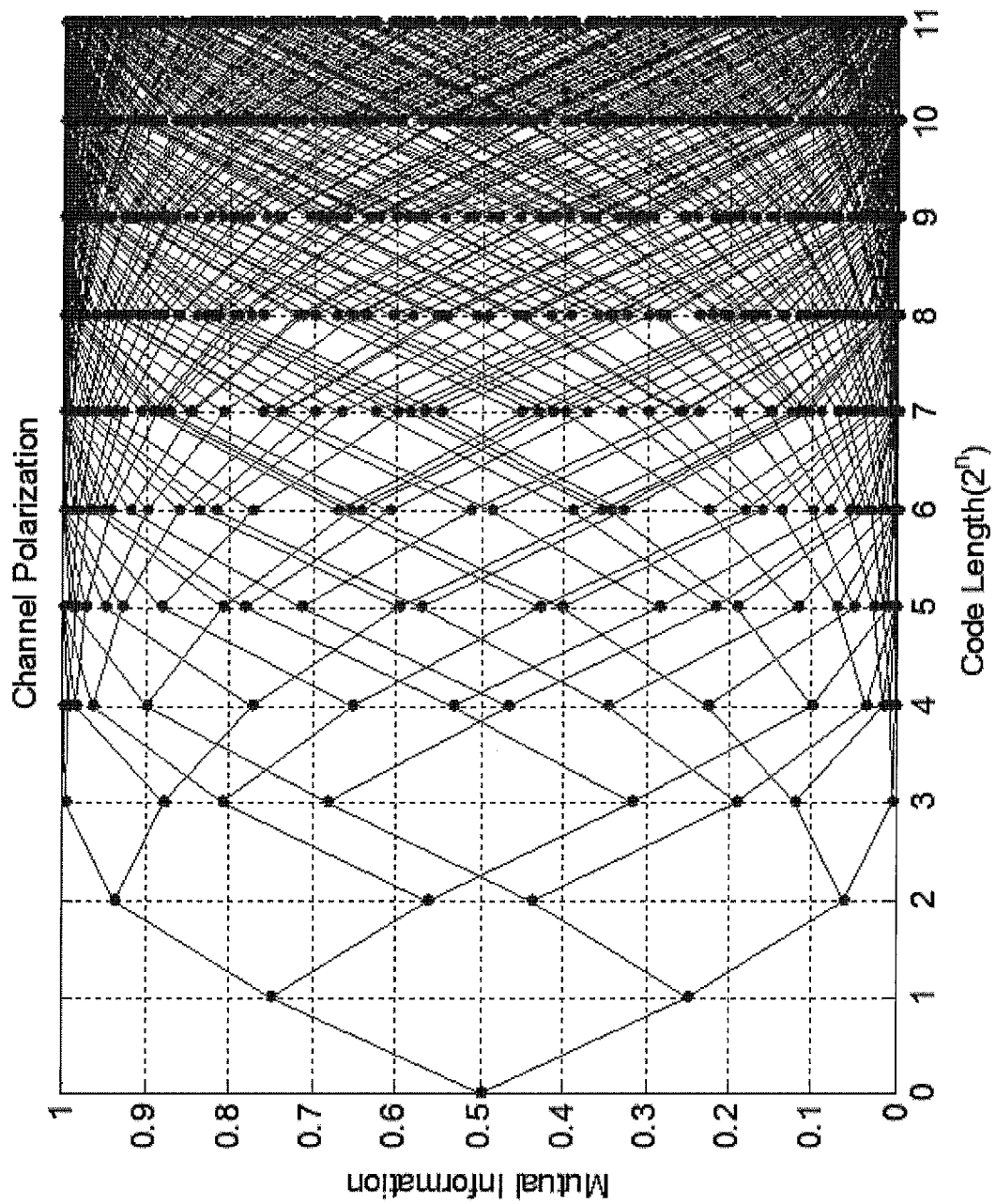
FIG. 3 illustrates an example of channel polarization, where n=11.

A method of constructing capacity achieving codes for the memoryless binary symmetric channel is known in the art (See Arikan, reference 1 above). The resulting polar codes leverage a phenomenon known as channel polarization (see FIG. 3) resulting from a recursive process by which the channel capacity, i.e. maximum mutual information, tends toward 1 (fully available) or 0 (unavailable). The corresponding bit probabilities, 1 and 0.5, respectively, approach their limits as the code length, $N=2^n$, increases with positive integer values n. Data may be transferred by placing information bits on the most reliable channels while bits placed on the least reliable channel may be set to a fixed value, e.g. 0. These bits may be referred to as frozen bits. Frozen bits and their mapping to the code matrix may be known by both the transmitter and receiver. As a result, frozen bits may be used as a reference by a decoding algorithm to determine whether an error has occurred from noise in the communication channel, or otherwise. For example, the known value of the frozen may be compared to the value determined through the decoding algorithm, to determine whether an error has occurred.

Information bits may be further categorized into 'good' information bits and 'bad' information bits, based on their simulated capacity or mutual information. Both the transmitter and receiver may likewise be configured to know which bits are good and bad information bits. As explained in further detail below, decoding algorithms may be configured to reduce the likelihood of decoding error by focusing increased scrutiny on the 'bad' bits.

Successive Cancellation Algorithm

To demonstrate the viability of the coding method, Arikan devised the successive cancellation (SC) decoder. While offering low complexity decoding, the decoder requires long block sizes, approaching a million (i.e. $2^{20}$) bits, in order to compete with rival Turbo or Low Density Parity Check (LDPC) Codes. The successive nature of the SC decoder additionally imposes significant limitations on decoder throughput.

Successive Cancellation List Algorithm

According to at least some embodiments, the method described herein may involve extension of the SC decoder in an effort to overcome limitations of the approach outlined by Arikan in reference 1 above. Tal and Vardy in reference 2 above describe a method of Successive Cancellation List (SCL) decoding. SCL decoding inspects two possibilities at each decoder phase in parallel: $\hat{u}_\varphi=0$ and $\hat{u}_\varphi=1$ for each non-frozen bit. The decoder may pursue multiple paths in parallel, retaining the most likely paths at each stage. The encoder may also append a cyclic redundancy check (CRC) that is ultimately used in determining the appropriate bit decision from the available L paths, see Balatsoukas-Stimming et al. in reference 4 above.

Polar Codes

Polar codes form a class of linear block codes described by a generator matrix, G. Polar codes of block lengths N may be generated according to:

$$G = F_N \overset{\triangle}{=} (F_2)^{\otimes n}$$

Where $F_N$ denotes the Kronecker product of $$F_2 = \begin{pmatrix} 1 & 0 \\ 1 & 1 \end{pmatrix},$$

among other possibilities.

A polar code is defined by the location of k information bits and (N−k) frozen bits in a block of length, N. The code rate, $$R = \frac{k}{N}$$

is expressed as the ratio of non-frozen bits to the block length. The code rate can be adjusted linearly by varying the number of non-frozen bits per block. Typically, the block length, N, is chosen to be a power of two, such that $N=2^n$, and n is a natural number.

Exemplary Polar Encoder

Figure 4:
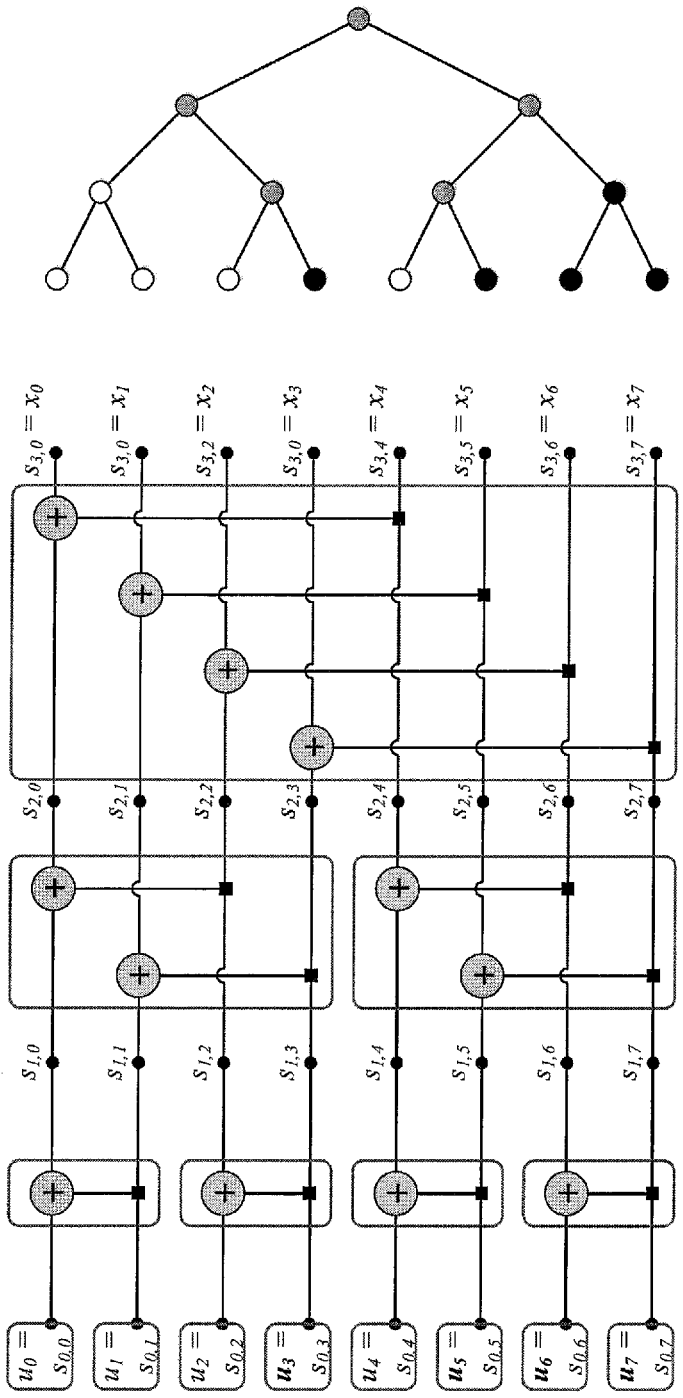
FIG. 4 illustrates an example encoder, where n=3.

FIG. 4 shows a sample polar code construction for block length $N=2^3$. The encoder begins with inputs, $u_i$, which are encoded into outputs, $x_i$. Information bits are shown in bold. The remaining inputs may be assigned frozen bit values, 0. At each stage, s, the encoder combines pairs of bits according to the encoding tree shown to the right, where ⊕ indicates an exclusive-OR (XOR) operation.

SC Decoder

The SCL decoder may be viewed in the updateLLR section (introduced further with reference to FIGS. 7-8) as a collection of SC decoders, each employing independent min-sum calculations on a row of the accumulated log likelihood ratio (LLR) statistics.

At each bit position, i, the SC decoder aims to estimate the bit $u_i$ as follows:

$$\hat{u}_i \triangleq \begin{cases} 0, & \text{if } i \in A_c, \\ 0, & \text{if } \ln\left(\frac{Pr(y, \hat{u}_0^{i-1})|u_i = 0}{Pr(y, \hat{u}_0^{i-1})|u_i = 1}\right) \geq 0, \\ 1, & \text{otherwise} \end{cases}$$

Where $$\ln\left(\frac{Pr(y, \hat{u}_0^{i-1})|u_i = 0}{Pr(y, \hat{u}_0^{i-1})|u_i = 1}\right)$$

computes the log likelihood ratio (LLR) at bit position, i, for the estimated information vector, u, given received symbol, y, and previously decoded bits $\{\hat{u}_0, \hat{u}_1, \ldots, \hat{u}_{i-1}\}$.

Figure 5:
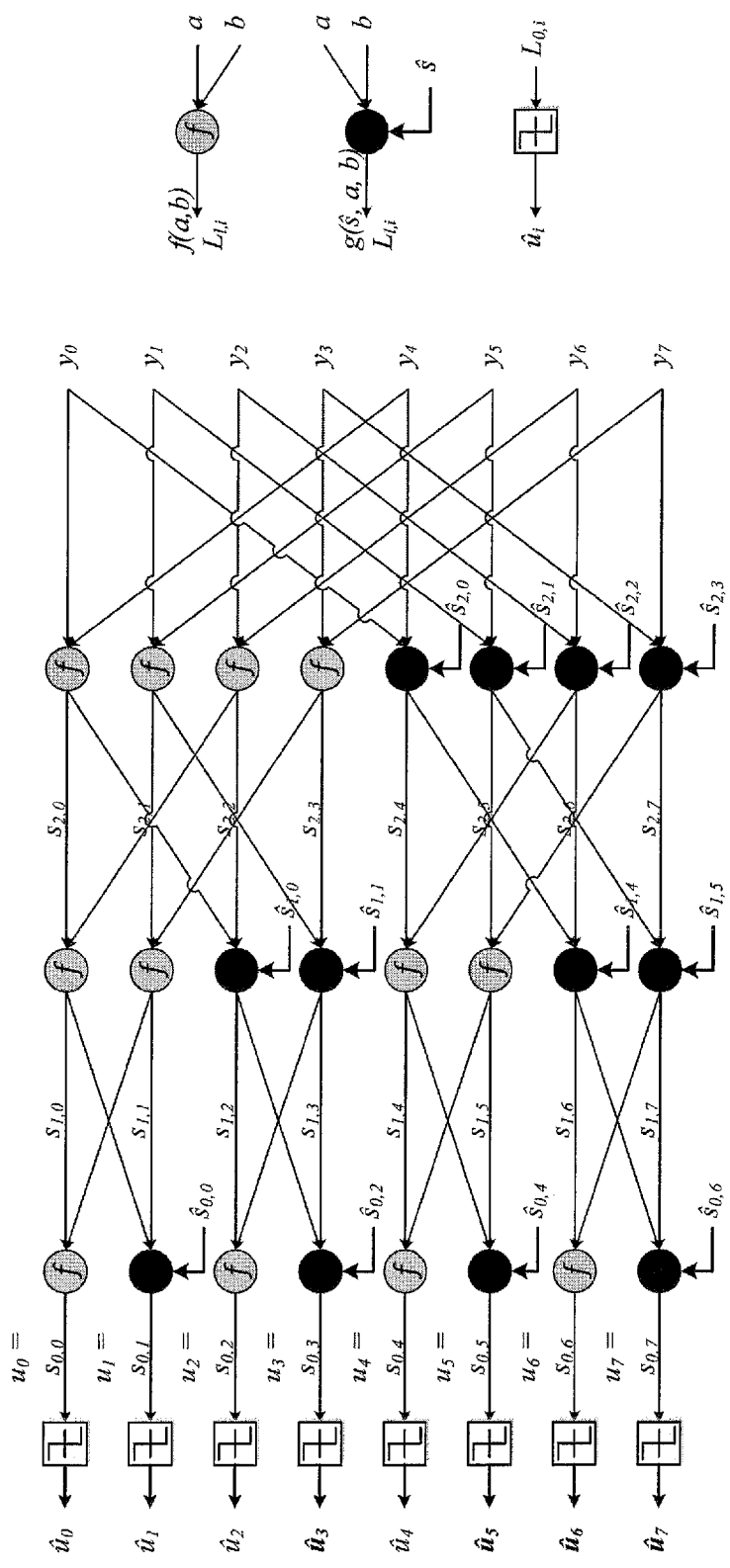
FIG. 5 illustrates an example decoder, where n=3.

FIG. 5 shows an example decoder where n=3, so that the block length $N=2^3$.

The decoder algorithm is applied recursively to the multi-stage diagram illustrated in FIG. 5 according to the following:

$$\lambda_{l,i} \triangleq \begin{cases} \lambda_f(\lambda_{l+1,i}; \lambda_{l+1,i+2}^{n-l-1}), & \text{if } \frac{i}{2^l} \text{ is even} \\ \lambda_g(\hat{s}_{l,z}; \lambda_{l+1,i}; \lambda_{l+1,i+2}^{n-l-1}), & \text{otherwise} \end{cases}$$

Where $\lambda_{l,i}$ denotes the LLR of row i and stage l of the SC decoder graph. The associated kernel calculations constitute the min-sum algorithm:

$$\lambda_f(\lambda_a, \lambda_b) = \text{sgn}(\lambda_a) \cdot \text{sgn}(\lambda_b) \cdot \min(|\lambda_a|, |\lambda_b|)$$

$$\lambda_g(\hat{S}, \lambda_a, \lambda_b) = \lambda_a(-1)^{\hat{S}} + \lambda_b$$

SCL Decoder

A list decoder may depart from the baseline SC decoder with the introduction of the path metric update section, updateU. At the completion of each bi-decoding stage, path metrics are updated accounting for the possibility of both possible bit values: $\hat{u}_i=0$ and $\hat{u}_i=1$. In some embodiments, a sorting operation may be performed to rank the paths in the list by their likelihood of being a correctly decoded string. The 'tree' of possible paths may then be pruned, retaining only the L most likely paths. The cycle of LLR calculations and path extension and pruning may be repeated for each bit in a transmission block, at which point the most likely path is chosen, revealing the best estimate of the payload data bits.

The SCL decoders described in references 2 and 4 above use the results of the sorting operation to direct multiple memory copies (memcpy), adding processing overhead as the LLR updates cannot resume until the memcpy operations have completed.

Memory Organization

Figure 6:
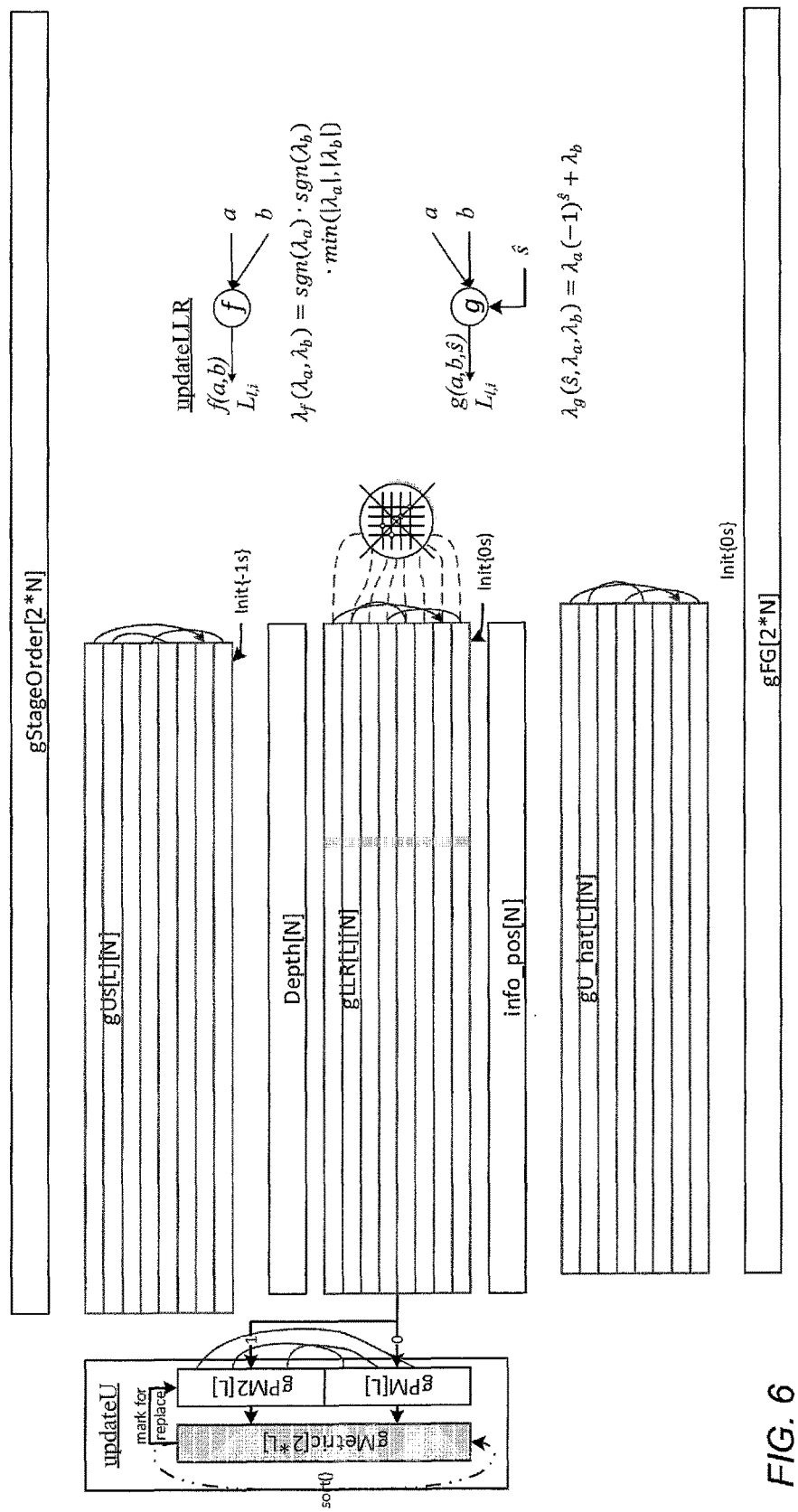
FIG. 6 illustrates an example SCL memory organization.

FIG. 6 illustrates an example SCL memory organization. The operation of an SCL decoder may be examined with respect to the underlying memory organization shown in FIG. 6. The LLR metrics, which may be referred to as bit statistics, may be stored in an L×N buffer gLLR[L][N], wherein L specifies the number of entries in the list and N specifies the length, in bits, of each path in the list. Each horizontal row of LLR metrics may be referred to as a path and may correspond to an instance of the decoder shown in FIG. 5. The different instances typically correspond to different bits for the u_hat values, which may be referred to as different 'bit paths'. For example, initially two bit paths may be spawned for u_hat(0)=1 and u_hat(0)=0, four bit paths may be spawned for second different combinations of u_hat(0) and u_hat(1), and so on. Each row may be assigned to a processing element of FIG. 2, in some embodiments. Once all available rows are filled, in some embodiments updateU ranks paths based on accumulated path metrics and prunes paths with a low likelihood of being the correct path. Processing elements on pruned paths may be assigned new paths, which may include copying a row of gLLR from a more likely path to a new memory element that neighbors the processing element that is assigned the new path. In some embodiments, given independent LLR updates per path, it might be easier to consider L separate LLR arrays each of dimension N. updateLLR operates independently per row of the L×N buffer. updateU computes path metrics, sorts, then marks rows of the path metric (PM) vector for replacement and reordering. The reordering may be carried out on rows of the LLR buffers directly. The intermediate Us and bit estimates, U_hat, may be modified according to the same reordering, as shown in FIG. 6. Note that the Us and U_hat may correspond to hard decisions. Therefore, their storage and memcpy requirements may be reduced. However, steps taken to reduce overhead associated with LLR buffer management may be applied to the Us and U_hat buffers as well.

Exemplary Method for SCL Decoding

In some embodiments, SCL decoding may be performed in the following manner. A processor may receive encoded communication data from a channel. The processor may comprise a plurality of processing elements, and a plurality of memories interspersed among the plurality of processing elements, wherein the memories are coupled to adjacent processing elements. The processor may be configured to decode the encoded communication data by repetitively performing decoding operations. The decoding process may be performed by a plurality of processing elements comprised with a processor. In some embodiments, each processing element may be configured to perform decoding operations on a respective bit path in a list of bit paths, wherein the decoding operations (e.g., updateLLR) generate bit statistics (e.g., path metrics) associated with the respective bit path. The bit paths and associated bit statistics may be stored in memories that are connected to the respective processing elements. As explained above, the bit path may comprise a potential decode of a portion of the encoded data, and the bit statistics may comprise a set of LLRs associated with the bit path that determine the likelihood of the bit path being a correct decoding.

In some embodiments, the method may continue by sorting the list of bit paths based on the bit statistics (e.g., the updateU procedure). In a process referred to elsewhere as 'pruning', a subset of the bit paths in the list of bit paths may be determined to be abandoned based on the sorting. The processor may be configured to notify respective ones of the processing elements that their associated bit paths are to be abandoned. The processor may be further configured to notify other respective ones of the processing elements that their associated bit paths are not to be abandoned. For example, bit paths associated with bit statistics that indicate a relatively low likelihood of the bit path being a correct decoding may be preferentially abandoned. In some embodiments, pruning may not be initiated until the bit paths have grown to a predetermined size, so that the list of bit paths is greater than a predetermined list size and a preconfigured number of processing elements are being concurrently used to perform the decoding operations.

In some embodiments, bit paths that were determined to not be abandoned may be used to generate two incrementally lengthened bit paths. e.g., the bits $u_i=0$ and $u_i=1$ may be added to the bit path to create two lengthened bit paths. To improve computational performance, the processing element may copy one of the lengthened bit paths and its associated bit statistics to another processing element whose respective bit path was abandoned. The decoding process may then proceed to a subsequent phase for the lengthened bit paths, whereupon each processing element may again have a single (lengthened) bit path upon which to perform decoding operations. In some embodiments, once pruning is initiated, the method may be configured to abandon half of the bit paths in each phase of the decoding process. In these cases, the total number of bit paths will remain unchanged from one phase to the next. For example, if the number of bit paths L is pruned to L/2, since each bit path is used to generate two lengthened bit paths, the pruned L/2 bit paths will produce L lengthened bit paths.

In some embodiments, the decoding process may occur a plurality of times for subsequent phases, wherein each phase comprises decoding operations being performed by processing elements on successively longer bit paths. The method may be configured to continue the decoding process until the length of the bit paths reaches a predetermined threshold. The method may be configured to select one of the bit paths in the final list of bit paths to be the properly decoded data. For example, after sorting is performed in the terminal phase of the decoding process, the bit path associated with the highest ranking bit statistics (e.g., the bit statistics with the largest log likelihood ratios) may be interpreted to be the properly decoded data. The method may be configured to then store the decoded data in a memory.

In some embodiments, in a process referred to as 'Selective Replacement', the processing elements may be configured to only copy portions of the lengthened bit paths and the associated bit statistics that are known to be different from the bit path and bit statistics stored in the memory to be copied to. For example, if a processing element B is determined to have its associated bit path (e.g., bit path B) abandoned, and a processing element A is determined to have its associated bit path generate two lengthened bit paths (e.g., bit paths $A_1$ and $A_2$), processing element A may only copy the bits in bit path $A_1$ that are different from corresponding bits in bit path B. Processing element A may further only copy bit statistics associated with bit path $A_1$ that are different from corresponding bit statistics associated with bit path B. The Selective Replacement process is additionally described in further detail below.

In some embodiments, in a process referred to as "Deferred Update", the processing elements may be configured to perform a subsequent phase of decoding operations on lengthened bit paths before copying one of the lengthened bit paths and associated bit statistics to a memory associated with another processing element. The processing element may generate updated bit statistics on each of the lengthened bit paths based at least in part on the decoding operations. In some implementations, the process of copying bit paths and bit statistics may introduce undesirable latency to the computational process. In these cases, performing subsequent decoding operations on lengthened bit paths may alleviate processing bottlenecks introduced by the copy process. The Deferred Update process is additionally described in further detail below.

In some embodiments, the simultaneous copying of a plurality of bit paths and bit statistics to respective processing elements may introduce undesirable latency in the copy process, as multiple processing elements may attempt to simultaneously copy data using the same memories. In these cases, it may be desirable to dynamically route the plurality of copy processes through a routing fabric comprised in the plurality of interspersed memories. For example, the copy processes may be dynamically routed to minimize conflicts between various ones of the copy processes, wherein a conflict comprises multiple copy processes simultaneously accessing a memory. In some embodiments, at least one of the processing elements may be designated as a master processing element, wherein the master processing element(s) communicate instructions for creating dynamic routes to each other processing element. Dynamic routing is additionally described in further detail below.

SCL Buffer Management

Figure 7:
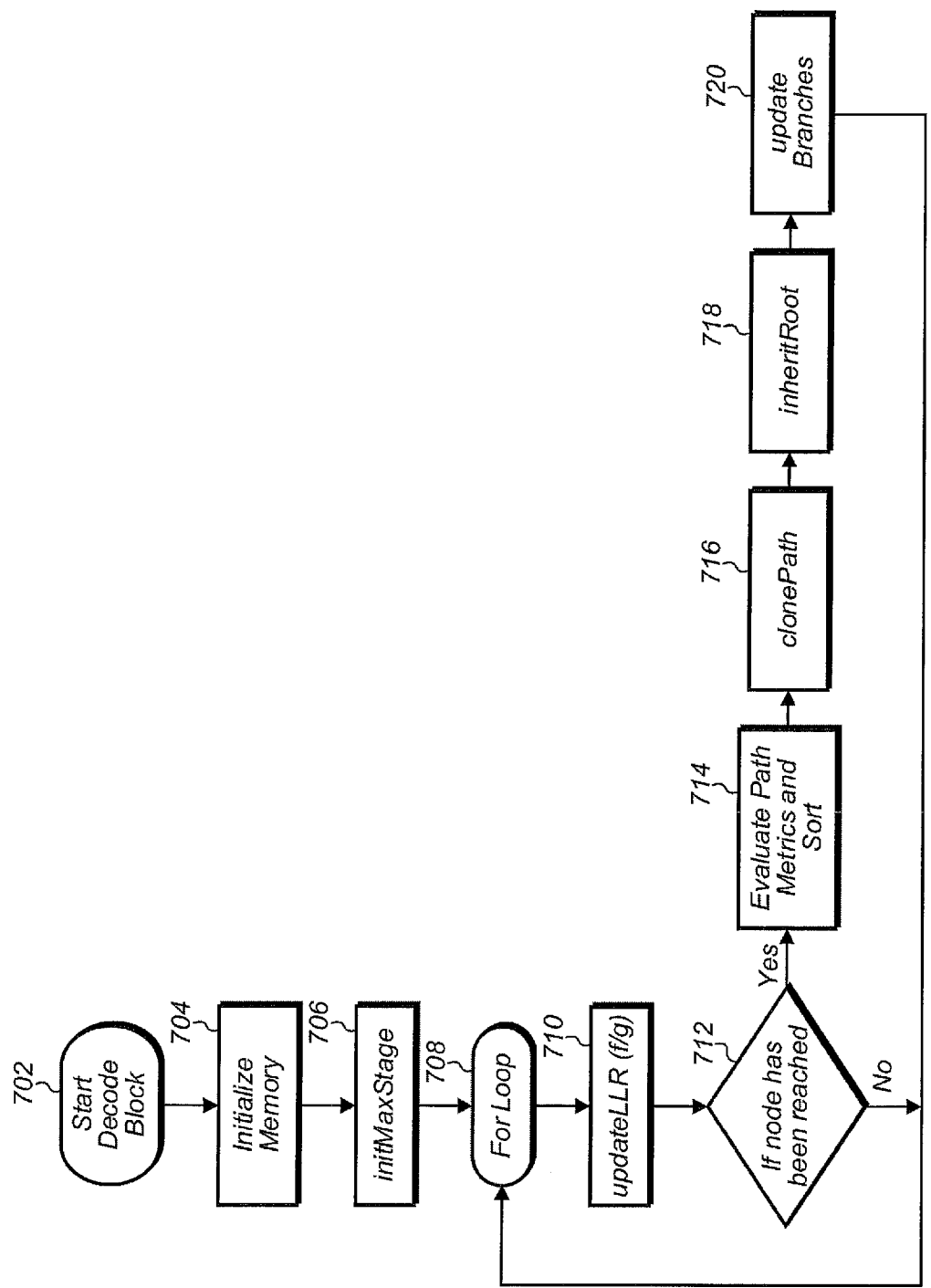
FIG. 7 is a flowchart diagram illustrating operation of a selective replacement decoder according to some embodiments.

FIG. 7 illustrates an example of the core decoder loop. As shown, the SCL decoder can be viewed as L independent SC decoders through the updateLLR stage. Path metric updates may occur with the completion of each decoded bit, accounting for both the $\hat{u}_i=0$ and $\hat{u}_i=1$ paths. After sorting, the most likely L paths may be identified. The remaining paths may be abandoned, so that statistics from one or more of the surviving paths may be copied into the vacated buffers in order for updateLLR processing to resume on the updated L paths. This process is referred to as cloning in reference 2 above.

Naive construction of the buffer management associated with SCL decoding might involve memcpy at the input of the updateLLR routine for each row replaced in the statistics buffers. Two techniques have been identified to significantly reduce the overhead incurred with memcpy on updates of the LLR statistics:

Selective Replacement: in some embodiments, this technique replaces only those statistics that will have been modified as opposed to updating entire rows of LLR statistics, large portions of which will not have changed between instances of updateU. In other words, for a given buffer row in gLLR of FIG. 6 that is to be copied, only a set of most-recent (e.g., entries to the right in the Figure) LLR statistics may be copied, rather than the entire buffer row. This may significantly reduce the amount of data transferred in cloning operations.

Deferred Update: in some embodiments, this technique involves computing LLR updates in-place, then forwarding the results to the intended destination array at the same time results are written to the in-place buffer. Rather than copying the input buffer to a new process before computing LLR updates, the proposed method instead computes both the $\hat{u}_i=0$ and $\hat{u}_i=1$ LLR updates within an existing process then forwards the results for one of the paths to the new destination buffer. By reversing the order of operation, the need to suspend processing while memcpy transfers take place may be avoided. In some embodiments, the proposed method performs updateLLR in-place, then streams the results to the destination process, as opposed to copying first and then initiating a new process. This method may alleviate processing bottlenecks by hiding the cost of the data movement alongside other processing.

Selective Replacement

Balatsoukas-Stimming et al. (in reference 4 above) discuss SCL decoders where at each step to a new bit position, L surviving paths are duplicated, (one for "0" valued bit extension and one for "1" valued bit extension). The 2L paths are then evaluated for LLR metrics, and sorted to keep only the L most likely paths. In order to duplicate paths LLR memory banks are copied. Their experimental hardware implementation of selective replacement is described as a single cycle customized hardware set of memory banks where LLR statistics are copied from one bank to another, and the solution results in an L×L crossbar. Crossbars ultimately will lead to latency in processing until the memory banks have completed their updates. At least some embodiments described herein operate to mitigate this impact to processing by reducing the number of memory transfers and aiming to attain close to L·N·log N complexity. The reduction in the amount of memory transferred may be accomplished by providing the parallel L-SC decoders with what each needs in order to decode the next set of bits before the next sort and update routine.

As discussed above, FIG. 7 illustrates a selective replacement decoder according to some embodiments. Because bad bits are more likely to have incurred an error in the communication channel, an SCL decoder may be configured to bifurcate the search into two paths at each bad bit decision (corresponding to a value of both 1 and 0 for the bad bit). In contrast, when an SCL decoder decodes a good bit, it may be configured to make a hard decision regarding the good bit, without bifurcating into two search paths.

Because the location of good and bad bits are known prior to decoding by both the transmitter and receiver, preliminary allocation of expected memory requirements (related to the expected frequency of path bifurcation) may improve computational performance, according to some embodiments. For example, in some embodiments, before calculating bit statistics, it may be desirable to construct a MaxStage table in preparation for the decoding process. To evaluate what statistics (LLR) are needed from one sort instance, i.e. from one bad bit instance to another, the routine InitMaxStage may generate a table that has a maximum size of K (information bits) (step 706). As explained in further detail below, the InitMaxStage algorithm constructs a MaxStage table that anticipates the memory requirements between the decoding of one bad bit and the next bad bit. The routine is described as follows:

---
Algorithm: initMaxstage
---
Input: Depth look up table of each bit processed, information (info_bit) position look up table, good bit (good) position look up table
Output: maxStage look up table indicating the maximum stage between bad bit n and bad bit n+1
set bad_bit to 0
for i = 0 ... N do
    if info_bit[i] = 1 and good[i] ≠ 1 then
        l ← i
        max ← Depth[l++];
        while info_bit[l] ≠ 1 and good[l] = 1
            ifDepth[l] > max then max ← Depth[l]
        end (while)
        maxStage[bad_bit++] ← max
end for

---

InitMaxStage traverses look up tables, information bit position, good bit position and depth of each bit decoded, that are known a priori at the decoder and encoder. In traversing the table, the algorithm derives an additional look up table that has a maximum size equal to the number of information bits encoded in the block code being decoded, upon which a sort routine is executed to determine which of the list of paths executed thus far have survived and which list of paths have to be killed. The maxStage look up table maps the current bad bit n to the next bad bit n+1. Consider each bank of LLR memory broken up into stages, the maxStage look up table signals the maximum stage traversed between the current bad bit and the next.

In further detail, the algorithm interrogates the bit assignments from i=0 . . . N to identify a first bad bit, i.e. info_bit[i]=1 and good[i]≠1, at which point the max depth is set to the depth of the first bad bit. The algorithm then proceeds to interrogate remaining bit assignments until the next information bit is encountered at which point the maximum stage to the next bad bit is set.

SCL decoder algorithms described herein may start by bifurcating paths at each bad bit instance until a predetermined number of paths, L, is obtained. Once the algorithm has multiplied into L paths, subsequent phases may be configured to prune each bifurcated set of 2L paths back down to L paths. The pruning may be performed according to the bit statistics associated with each path, so that paths which are more likely to be an incorrect decode are more likely to be pruned, or abandoned. Once pruning has commenced, each bit path that was not abandoned will generate two lengthened bit paths, and one of these lengthened bit paths (along with associated bit statistics) may be copied to a processing element whose bit path was determined to be abandoned. In this case, the processing element that spawned the two lengthened paths may be considered a 'root', and the processing element that received the bit path from the root may be considered a 'branch' of the root.

References 2 and 4, above, discuss the evolution of paths that result from an SCL decoder processing a sequence of bits, and discuss path "killing" (equivalently pruning, or abandoning) and "cloning" (duplicating of paths) as a result of an included sort procedure. This is typical of SCL decoders, and in selective replacement decoding there is a need to keep track of active (surviving) and inactive (killed) paths and their associated statistics. This tracking may be accomplished with a basic table of dimension L referred to as the relationship database (relDB), that relates a "root" path with its bit-extended "branches". This relDB array connects the processing elements (PE) to bit statistics from path j; see clonePath regarding usage. When a path is not replaced, its relDB[PE]=PE, otherwise relDB[PE]≠PE.

In selective replacement decoding the routine of clonePath accomplishes the task of copying a bit path and associated bit statistics from one processing element to another (step 716). clonePath copies path metric data from memory locations for an active (survivor) path j to memory locations of the PE for one of the deemed inactive paths. The size of the data transfer is conditioned on the depth for the current bit position having reached the maxStage for that bit position. The clonePath algorithm is described as follows:

---
Algorithm: clonePath
---
Input: sorted paths, depth of current decoded bit, position of current decoded bit (bad_bit)
Output: update relationship database, update PE's path watermarkDB, and evaluate amount of data that needs to be transferred
for PE = 0 ... L−1
    if processing element PE's path is in the set of inactive paths then
        find j in the set of active paths and
            relDB[PE] ← j
        if depth[bad_bit] = maxStage[bad_bit] or
        (depth[bad_bit+1] = maxStage[bad_bit]
and depth[bad_bit] = 1) then
            memcpy only 2^maxStage[bad_bit] of data from LLR memory j to PE
from memory address gLLR[PE][ 2^maxStage[bad_bit]]
        else
            memcpy 2^( maxStage[bad_bit] − depth[bad_bit]) of data from LLR ---
Algorithm: clonePath
--- memory j to PE from memory address gLLR[PE][ 2^depth[bad_bit]]
      end if
    watermarkDB[PE] ← maxStage[bad_bit]
end for

---

In this design clonePath updates two databases, the relationship database associating the path (now a branch) to its root, and the watermarkDB database tracks the validity of data in the memory bank of LLRs for an associated PE. Transferring or memory copying data from one LLR processor to another removes the impact of memory bank conflicts during the subsequent processing stage, and transferring only memory that is needed ensures memory transfers are in line with the complexity of subsequent processing stages. Unlike some prior systems, memory transfers using method clonePath may not need to be customized which may reduce the impact and/or occurrence of crossbars. However, as a result of clonePath, the set of paths are divided into roots, and branches.

In further detail, the algorithm identifies each path in the set of PEs=0 . . . L−1 that have been deemed inactive and pairs it with one of the deemed survivor paths, j. If the depth of the current bad bit has reached the maxStage for that path, then a portion, 2^maxStage[bad_bit] of data from LLR memory is copied from j to PE's path starting at memory address gLLR[PE][2^maxStage[bad_bit]] (See FIG. 6). Otherwise, a smaller portion, 2^(maxStage[bad_bit]-depth[bad_bit]), of data from LLR memory is copied from j to PE's path starting at memory address gLLR[PE][2^depth[bad_bit]]. Finally, watermark the maxStage for that layer.

In some cases, after several phases of the sort process, a scenario can occur where roots are out-survived by their branches. Routine inheritRoot is designed to handle scenarios where paths out-survive their roots (step 718):

---
Algorithm: inheritRoot
---

Input: sorted paths, maximum watermark needed based on current bit position
Output: update relationship database, update PE's path watermarkDB, and evaluate amount of data that needs to be transferred
for PE = 0 ... L − 1
    if relDB[PE] is in set of inactivePath and PE's path is in set of activePath then
        while watermarkDB[PE] < maximum watermarkDB
            currentwartermark ← watermarkDB[PE]
            memcpy to PE from relDB[PE] at address 2^[ watermarkDB[PE] ] , 2^[
watermarkDB[relDB[PE] ]] − 2 [ watermarkDB[PE] ] data
            watermarkDB[PE] ← watermarkDB[relDB[PE]]
        end while
        relDB[PE] ← PE // detach path from its roots
end for

---

Once the branches whose roots have not survived have been processed, the branches that have to be updated for the next set of stages are processed by routine updateBranches (step 720):

---
Algorithm: updateBranches
---

Input: sorted paths, maxStage, current bad bit index
Output: update relationship database, update PE's path watermarkDB, and evaluate amount of data that needs to be transferred
forPE = 0 ... L − 1

---
Algorithm: updateBranches
--- if PE's path is in set of activePath then
    if depth[bad_bit] = maxStage[bad_bit] or (depth[bad_bit+1] = maxStage[bad_bit])
    and depth[bad_bit] = 1) then
        memcpy only 2^maxStage[bad_bit] of data from LLR memory j to PE
from        memory address gLLR[PE][ 2^maxStage[bad_bit]]
    else
    memcpy 2^( maxStage[bad_bit] − depth[bad_bit]) of data from LLR memory j to PE from memory address gLLR[PE][ 2^depth[bad_bit]]
    end if
    watermarkDB[PE] ← maxStage[bad_bit]
end for

--- updateBranches copies data after path sorting from a survivor memory to one of the deemed inactive paths. The size of the data transfer is conditioned on the depth for the current bit position having reached the maxStage for that bit position.

These disclosed functions may significantly reduce the amount of data transferred in cloning paths, in various embodiments.

Deferred Update

Deferred update, in some embodiments reverses the sort and replace operations followed by updateLLR to allow in-place computation of the LLR updates, directing the result to the appropriate destination buffer while the next updateU calculations are being performed. The aim is to "hide" the data communication underneath other processing to minimize the overhead incurred with memcpy instead. Deferred update is compatible with the method described above of Selective Update in that the latter reduces the required data movement making it that much easier to conceal if done in parallel with other processing.

Figure 8:
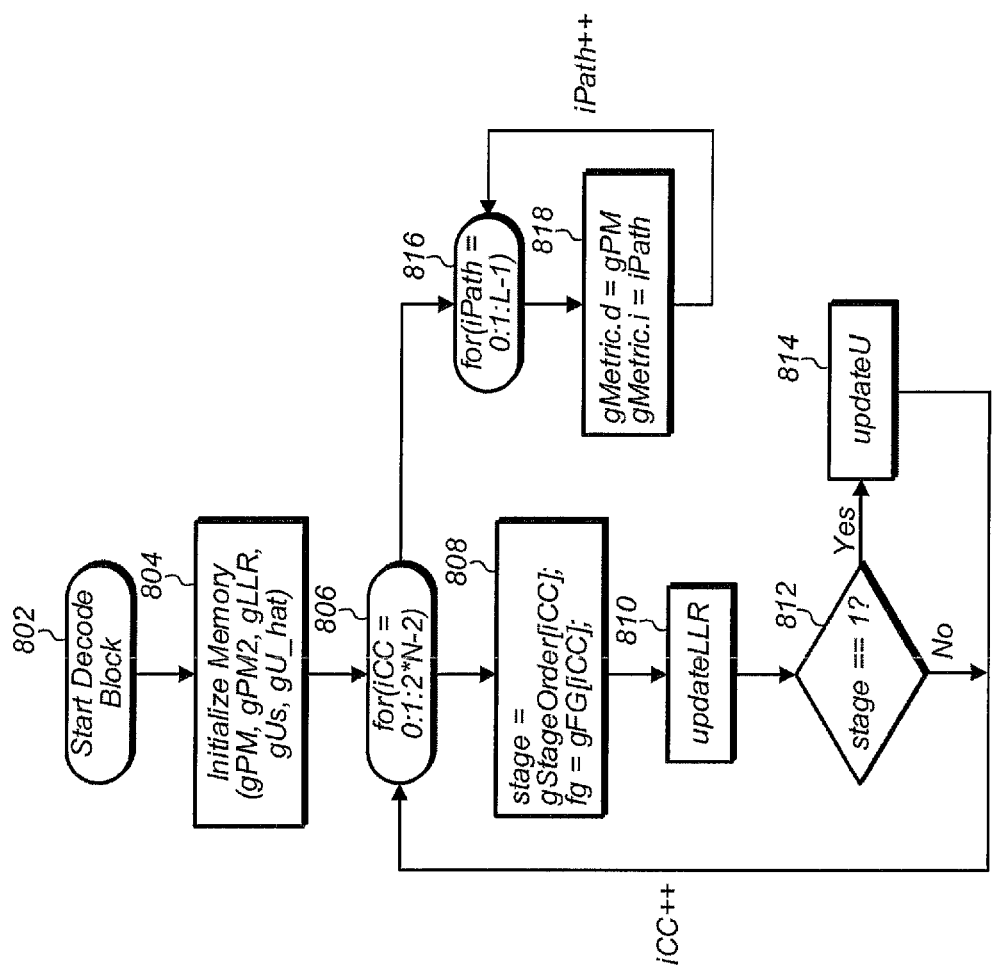
FIG. 8 illustrates a main processing loop of a decoder (core decoder loop) which may perform deferred updates according to some embodiments.

FIG. 8 is a flowchart diagram of a decoder operation including a deferred update operation. The deferred update operation may occur in the updateU step, in some embodiments.

In prior methods, the update U step may take the form of:
Update path metrics;
û=0; û=1, results in doubling the number of paths (e.g., from 32 to 64)
Select most likely survivor paths
Designate remaining paths (rows) for replacement
Copy survivor(s) to replacement buffers
    Resume update LLR This may, however, result in functional units being relatively idle while waiting for the copy step. Therefore, in some embodiments, the updateU step may take the form of:
Update path metrics;
û=0; û=1, results in doubling the number of paths (e.g., from 32 to 64)
Select most likely survivor paths
Designate remaining paths (rows) for replacement
Proceed immediately with updateLLR on survivor paths,
    including to compute "0" path and "1" path in-place, and stream results to the local and replacement buffers (one of the computed paths may be streamed to the local buffer and the other to the replacement buffer)

In these embodiments, updateLLR is performed for both paths in-place, prior to the copy operation. The copying may be performed using a memcpy or direct memory access (DMA) transfer, for example, in these embodiments.

Exemplary Path Generation and Cloning Variations

In some embodiments, rather than updating path metrics for all 2L paths each phase, the decoder is instead configured to first select the most likely L/2 paths that survived the previous phase, extend the bit=0 and bit=1 cases for these most likely L/2 paths, and use these results to continue with L paths in the next phase. This technique may be used in conjunction with various other techniques disclosed herein, such as deferred update and selective replacement, for example.

Exemplary Mapping of Functional Units to Paths and Priority Tracking

In some embodiments, the decoder includes a master processing element configured to maintain one or more data structures to determine which processing element is responsible for which path and the relative priorities (e.g., based on path metrics) of the various different paths. The master processing element may also be configured to select paths for pruning, instruct processing elements to transfer path data for cloning operations, set up and tear down communications paths for data transfers, etc. In some embodiments, the master processing element is one of the processing elements in a multi-processor array as shown in FIG. 2. In other embodiments, the master processing element may be a dedicated functional unit.

During each phase of the decoding process, the relative likelihood of paths may change, e.g., as determined by sorting operations. Thus, the master processing element may maintain a mapping of the relative priority of each path. For example, a currently-most-likely path A after a given phase may be assigned priority 0 while a currently-least-likely path B may be assigned priority 31, in an embodiment in which L is 32, for example. In a subsequent phase, however, path A may no longer be most likely and may be assigned priority 7, for example. Further, the processing element may keep track of which path is assigned to which processing element and/or local buffer. This may allow a determination of which memory buffer to use to generate properly received data bits at the end of the decoding process (this is typically the most-likely path based on path metrics at the end of the last phase, although other paths may be selected, e.g., if another path meets a cyclic redundancy check and the most likely path does not).

In other embodiments, mapping of functional units, paths, and priorities may be performed in a distributed fashion (e.g., without a master controller) in which each processing element maintains at least a portion of the mapping information and the processing elements communicate to determine where to prune and clone, for example, in a given phase.

Exemplary Routing Techniques

In some embodiments, it is desirable to avoid a crossbar, e.g., to avoid data transfer latency between phases for cloning operations. In multi-processor array (MPA) embodiments, e.g., as shown in FIG. 2, the decoder may be configured to dynamically set up and tear down communications pathways for each phase. For example, consider exemplary processing elements A, B, and C. In a first phase, processing element A may need to transfer its buffer of LLR statistics (or a portion thereof, e.g., using selective replacement) to processing element B (e.g., processing element B's path may have been pruned). In some embodiments, the decoder may be configured to dynamically set up a route for the transfer such that processing element A can simply initiate a DMA transfer via the route and then forget about it. In some situations, the routing may be performed such that there are no conflicts for communications resources (e.g., the transfer does not use data memory routers used for other transfers in the same phase, or the transfer can be performed in parallel with other data transfers based on the throughput capabilities of the data memory routers). In other situations, there may not be enough communications resources to completely avoid conflicting routes, but in these embodiments, processing element A can still kick off a DMA transfer and it will be performed whenever communications resources are available in the current phase. The route between processing element A and processing element B may be torn down once the phase is complete. In a subsequent phase, consider a situation where processing element A now need to transfer path statistics to processing element C. In this phase, the decoder may set up a route from processing element A to processing element C.

Thus, dynamic routing may improve performance and efficiency of communications relative to a crossbar implementation, and may be enabled by the MPA architecture described above. As shown in FIG. 6, direct routes between buffers may eliminate the need for a crossbar. The dynamic routing may be "dynamic" in the sense that the set of communication routes may change in each phase of the polar decoding process.

In some embodiments, a master processing element, as described above, may set up and tear down communications pathways. In other embodiments, individual processing elements (e.g., the transferring processing element(s)) may be configured to set up and/or tear down the pathways.

Figure 13:
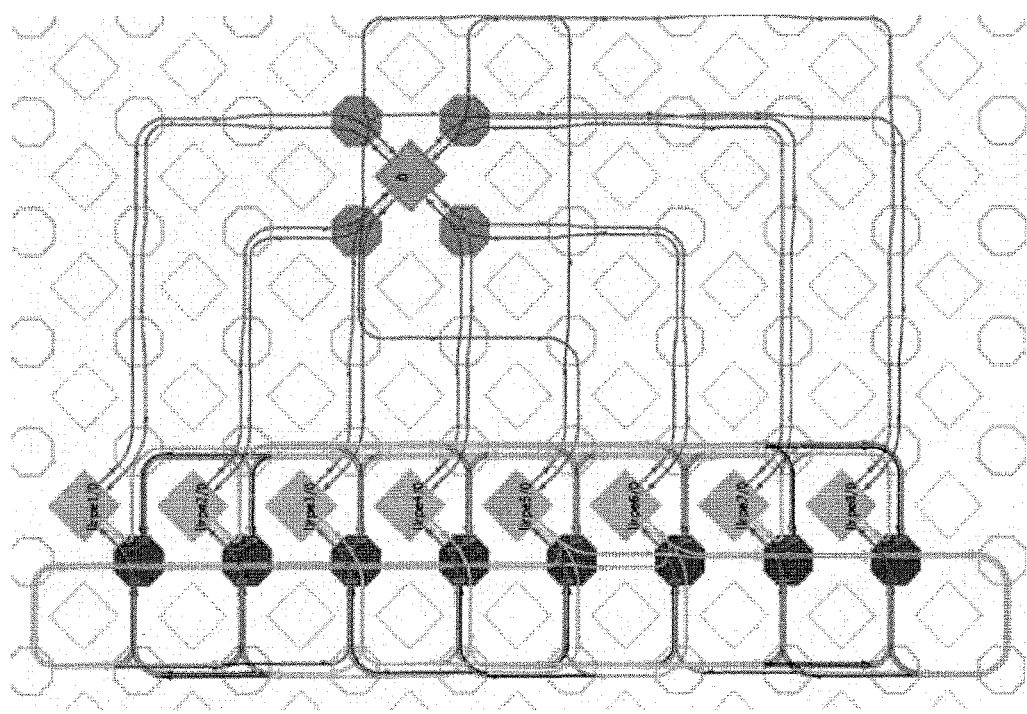
FIG. 13 illustrates a multi-processor array configured to implement a decoder with L=8 using a master processing element, according to some embodiments.

FIG. 13 shows an exemplary MPA that has been configured to implement a polar decoder with L=8. In the illustrated embodiment, PEs 1-8 are configured to operate on horizontal rows in the buffer gLLR of FIG. 6 and may each run a separate instance of an SC decoder. These PEs may be configured to perform the updateLLR phase. In the illustrated embodiment, PE 0 is configured as a master controller, as described above according to some embodiments. In some embodiments, PE 0 is configured to send data movement pair assignment for transfer of LLR statistics to new paths. The routes between the PEs 1-8 are used for this data movement, and may be set up and torn down dynamically for each phase (e.g., each update instance). The routes from PE 0 to the other PEs may be used to assign priorities, indicate status, and/or initiate data movement, for example.

Exemplary Sort Techniques

In some conventional SCL decoder implementations, the performance of the path sorting operations may be relatively unimportant because of the data transfer challenges for SCL decoding. With use of the above techniques, however, the data transfer latency may be greatly reduced. In this case, performance of the sort may have a greater effect on overall decoder performance. Improvement in sorting techniques may therefore be desirable.

Optimal Sort

In some embodiments, path metrics record a running sum of the estimated uncertainty in a bit path. For example, for each frozen bit decision, the path metric may be increased if the decoded frozen bit differs from the known value of the frozen bit. In this case, the path metric may be increased by an amount equal to the magnitude of the log likelihood ratio of the frozen bit (i.e., if the frozen bit is more confidently calculated to be an incorrect bit, the path metric, and hence the uncertainty in the path, will increase by a larger amount). In these embodiments, the path metrics will strictly increase or remain the same as the length of the associated path increases.

A conventional SCL decoder algorithm with maximum path length L will sort 2L path metrics, half with an additional bit set to 0 and half with the additional bit set to 1. To improve performance, it may be desirable to minimize the number of items to sort where possible. In some embodiments, a sort may be performed of the 2L path metrics, without loss of quality, using two separate sorts of sizes L and L/2. This approach uses the observation that updated path metrics are guaranteed to be equal to or larger than the path metrics (PMs) from which they are updated, and that at most L/2 path metrics will be updated.

Figure 9:
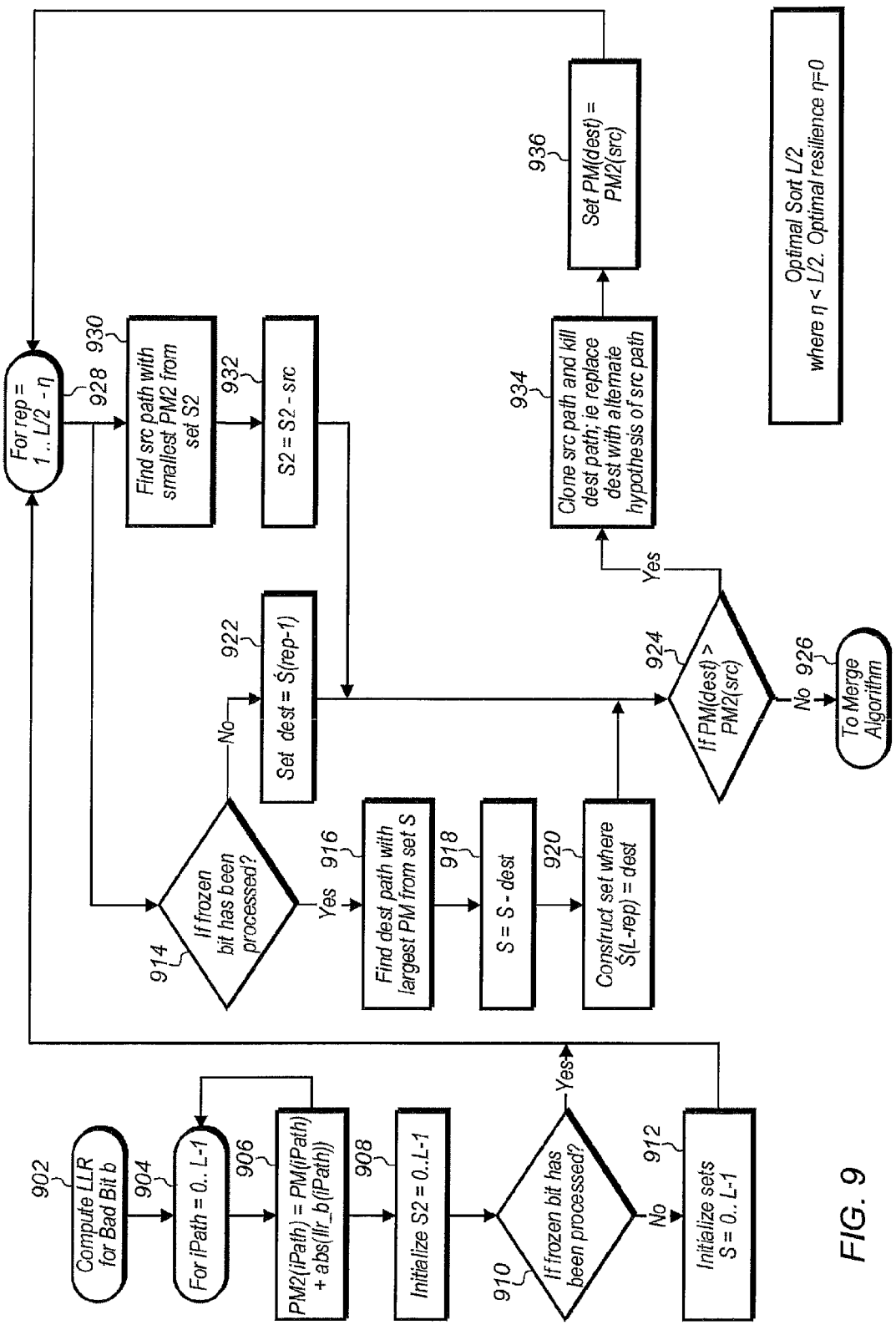
FIG. 9 is a flowchart diagram illustrating operation of an optimal sort algorithm according to some embodiments.

FIG. 9 illustrates an exemplary optimal sort algorithm, according to some embodiments. A log likelihood ratio (LLR) may be computed for an encountered bad bit for each of the L paths (step 902). A positive LLR may indicate that the bad bit is more likely to be a 0, and a negative LLR may indicate that the bad bit is more likely to be a 1. Two sets of path metrics, PM and $PM_2$, may be generated for each of the L paths. Each PM may be associated with each respective path that appends the more likely bad bit value (i.e. PM is associated with the path that appends 0 if the LLR for the bad bit is positive and 1 if the LLR is negative), and each PM may be set to equal the path metric of the respective path prior to appending the bad bit value (i.e., the PM remains unchanged from the previous phase). Each $PM_2$ may be associated with each respective path that appends the less likely bad bit value (i.e., $PM_2$ is associated with the path that appends 1 if the LLR for the bad bit is positive and 0 if the LLR is negative), and each $PM_2$ may be set to equal the path metric of the respective path prior to appending the bad bit value, plus the absolute value of the LLR of the respective bad bit (steps 904-908). In this way, each $PM_2$ will be larger than its associated PM.

Next, the set of PMs may be sorted in descending order (repetition of steps 916-920), and the set of $PM_2$s may be sorted in ascending order (repetition of steps 930-932), comprising two sorts of size L. The maximum of the PMs may be compared to the minimum of the $PM_2$s (step 924). Depending on the comparison, several outcomes are possible.

If the maximum of the PMs is less than the minimum of the $PM_2$s, then all of the $PM_2$s will necessarily be larger than each of the PMs, and all of the paths associated with the $PM_2$s may be abandoned (step 926, with a null merge algorithm because rep=1). In this case, the decoding process may proceed with the paths associated with the PMs.

If the maximum of the PMs is greater than the minimum of the $PM_2$s, then some of the $PM_2$ paths will replace some of the PM paths (steps 934-936). As explained below, a maximum of L/2 paths will be replaced, because each $PM_2$ is strictly larger than its associated PM. In other words, each $PM_2(i)$ that is less than a PM(j) (so that the $PM_2(i)$ path may replace the PM(j) path) will be associated with a PM(i) that is less than $PM_2(i)$, and the PM(i) path may not be replaced so that a maximum of L/2 replacements may take place. Because of this, only the first L/2 PMs in the descending list of PMs may be compared to the first L/2 $PM_2$s in the ascending list of $PM_2$s to determine potential replacements. In other words, the resulting algorithm may retain separately the smallest L/2 of the existing PMs (set A), the largest L/2 of the existing PMs (set B), and the smallest L/2 $PM_2$s (set C). It then sorts set C, and identifies where set C might displace set B.

Because the computational time and resources required to sort a list increase exponentially with the size of the list, performing sequential sorts of size L and L/2 may provide greatly improved performance compared to a single sort of size 2L. Furthermore, the amount of improvement obtained in these embodiments may increase as the list size L increases.

Low Latency Sort

Figure 10A:
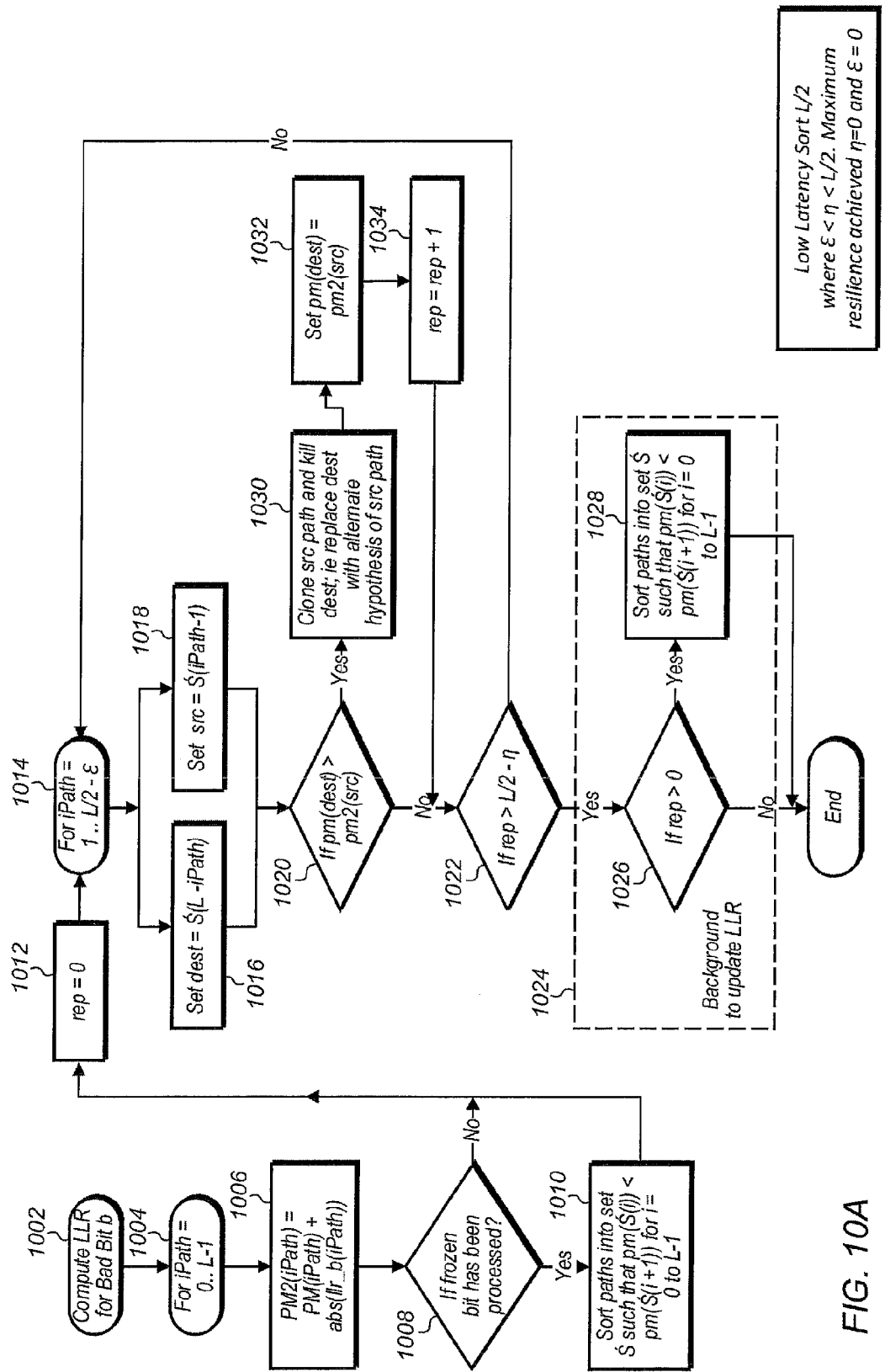
FIG. 10A is a flowchart diagram illustrating operation of a low latency sort algorithm according to some embodiments.

The preceding embodiments describe sort algorithms that optimally sort a list of length 2L. In other words, the preceding embodiments provide optimal resilience by sorting each entry in the list. In some embodiments, it may be desirable to reduce the latency of the sort procedure, at the cost of sub-optimal sort performance. In these cases, as illustrated in the flow chart of FIG. 10A, a combination of one or more of the following adjustments may be made to the sort algorithm to reduce latency.

Figure 10B:
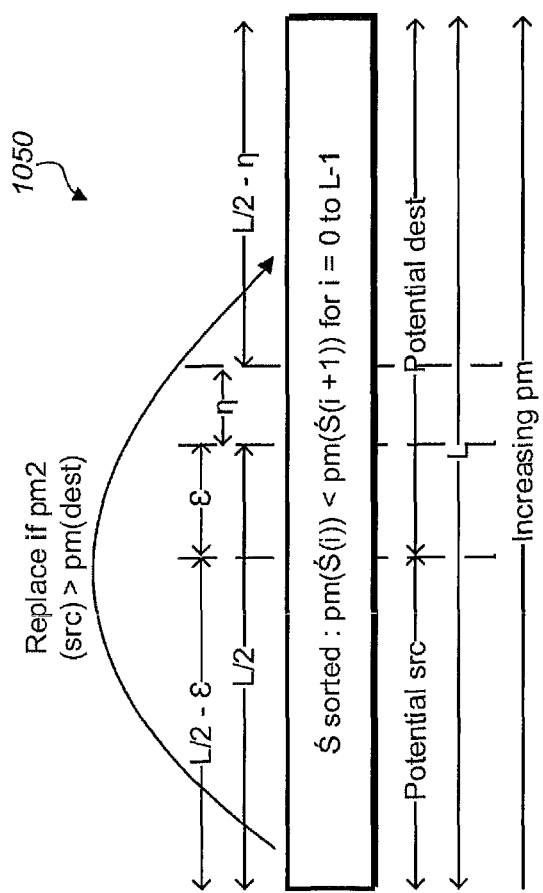
FIG. 10B is a graphical illustration of the variables $\epsilon$, $\eta$, and L in a low latency sort algorithm, according to some embodiments.

In some embodiments, computational time and resources may be reduced by only performing the sorting algorithms described above on a fraction, L-ϵ (step 1014), of the paths, where ϵ is a parameter. The role of ϵ is illustrated graphically in FIG. 10b. In these embodiments, ϵ may be selected to optimize the tradeoff between decoding performance and latency/throughput. In other words, increasing ϵ will decrease the size of the sort, at the cost of also decreasing the accuracy of the decode.

In some embodiments, if the maximum of the PMs is greater than the minimum of the $PM_2$s, the first L/2-η PMs in the descending list of PMs may be compared to the first L/2-η $PM_2$s in the ascending list of $PM_2$s to determine potential replacements, where η is an integer parameter (steps 928 and 1022). The role of N is illustrated graphically in FIG. 10b. η may serve a comparable function to ϵ, in that increasing η may reduce the size of the sort at the cost of decreasing its accuracy.

In some embodiments, even better performance may be obtained (using a search of size L/2) in situations where a cluster of frozen bits has not been hit. In some embodiments, a cluster is a number of frozen bits from 1 to N times R where R is the rate of the polar codec. In some embodiments, every time a frozen bit is encountered, the path metrics are altered. Therefore, the sort may only need to be performed after the frozen bits have been processed (e.g., at the end of the cluster before the next information bit (i.e., non-frozen bit), see steps 916-920 and 1010).

If a frozen bit has not been encountered (steps 910, 914, and 1008), then the algorithm described in further detail above may ensure that the list is sorted for the next phase. In this instance, the sort and selection can be performed using an L/2 sort (steps 916-920 and 1010). This may be performed by skipping the initial L sorts of the PMs and $PM_2$s in the techniques above when a frozen bit has not been traversed (steps 912 and 922), since the PMs and $PM_2$s will not have changed from the previous sort procedure if a frozen bit has not been traversed since the previous sort procedure. In some embodiments, this may result in an L/2 sort, further improving computational time and resources.

In some embodiments, the $PM_2$s for each path may be sorted based on the sorted order of the PMs for each path (steps 1016-1018). In particular, in some embodiments, the PMs may be first sorted in descending order (a size L sort). The $PM_2$s may then be ordered in the reverse order of the PM sort, without necessitating the latency of a second size L sort. Each $PM_2$ comprises the accumulated path metrics for each encountered frozen bit, plus the additional log likelihood ratio for the presently encountered bad bit. Once a sufficient number of frozen bits have been encountered, the addition of a single log likelihood ratio for a bad bit may be very unlikely to change the order of the $PM_2$s relative to the PMs (i.e., a single LLR may be unlikely to introduce a larger discrepancy between paths than the accumulated LLRs of a large number of frozen bits). As a result, it may be desirable in some embodiments to sort the $PM_2$s in the reverse order of the PMs once a predetermined threshold number of frozen bits have been encountered. In other embodiments, the $PM_2$s may always be sorted in the reverse order of the PMs. These embodiments may significantly reduce computational latency with only a limited impact on sort resilience.

Figure 11:
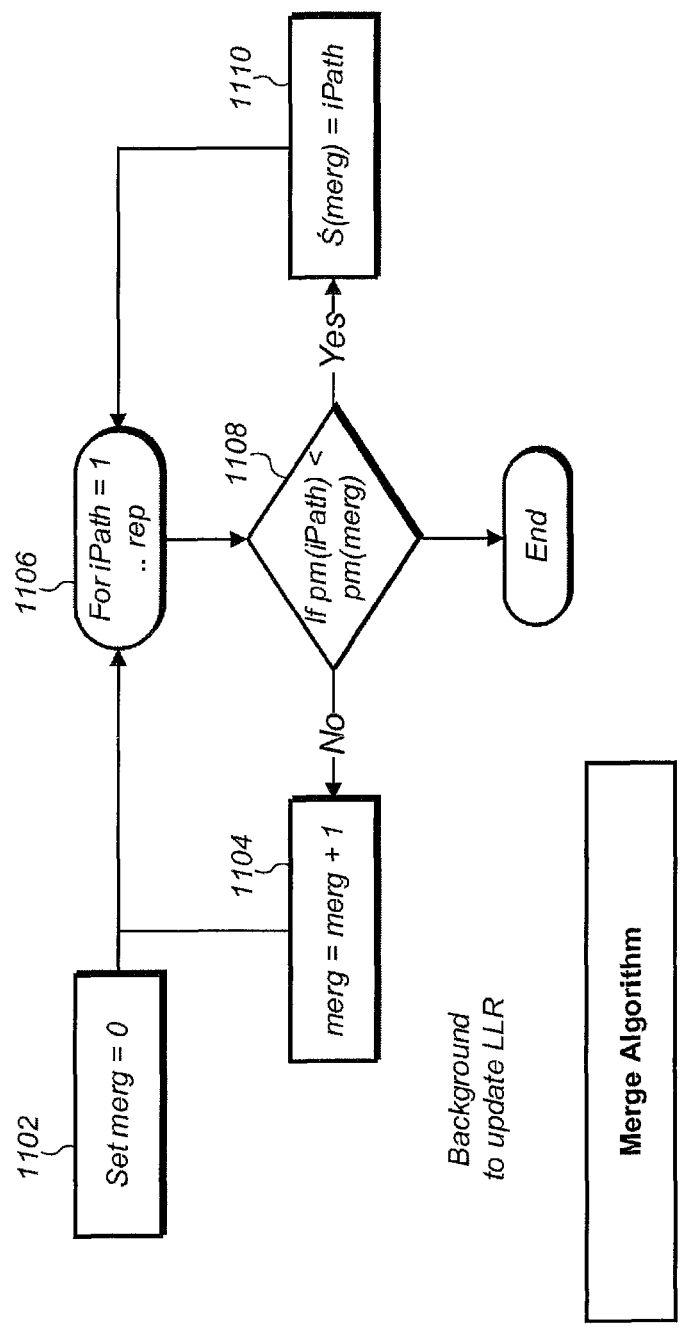
FIG. 11 is a flowchart diagram illustrating operation of a merge algorithm according to some embodiments.
Figure 12:
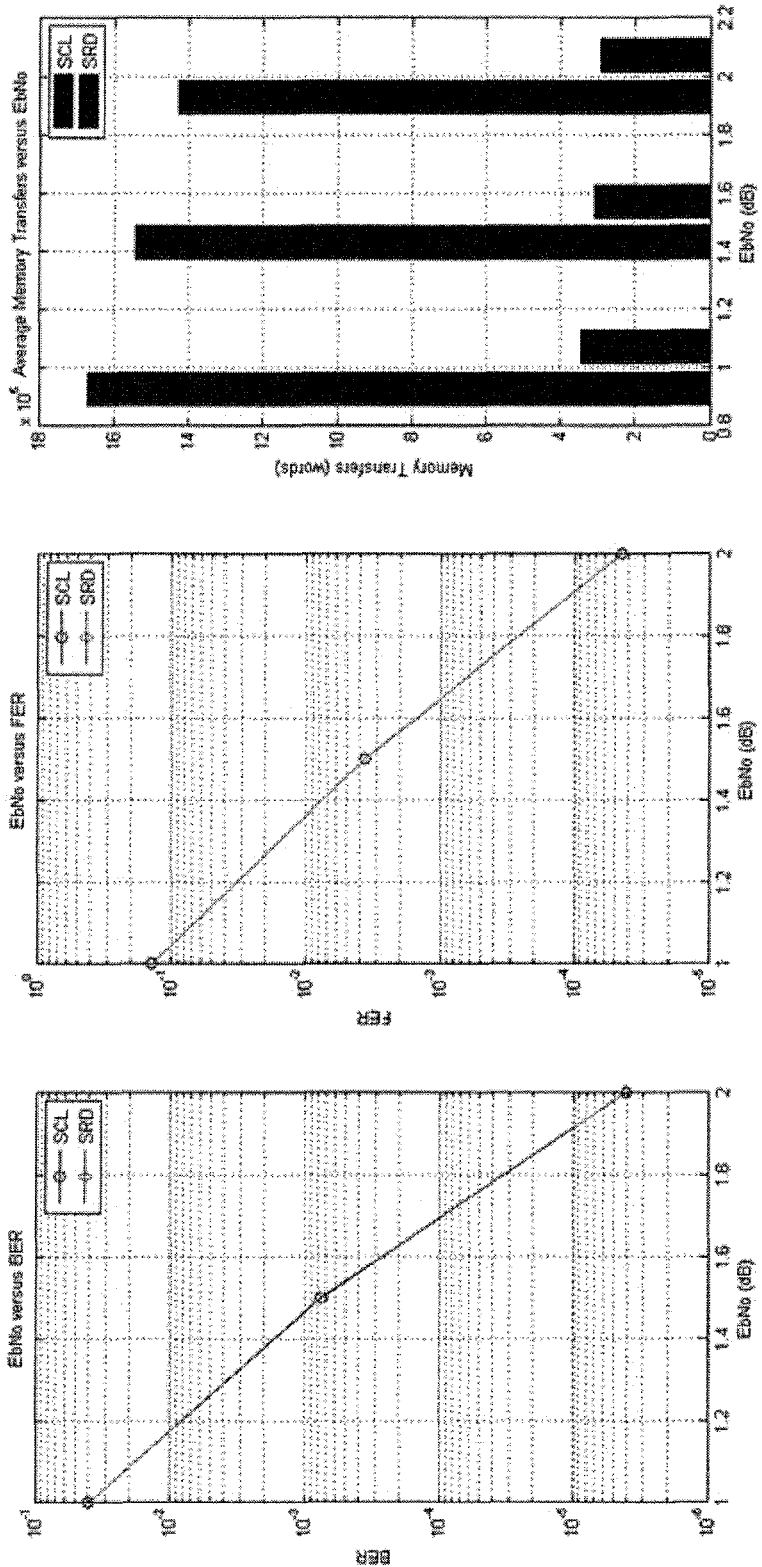
FIG. 12 illustrates comparison of decoding performance in the presence of noise and memory moves for the methods described herein.

FIG. 11 is a flow diagram illustrating an exemplary merge algorithm, according to some embodiments. The merge algorithm may be used after the completion of the optimal sort algorithm described in FIG. 9. At step 1102, a merg counter is set to zero. At step 1106, a for loop is initiated for each value of iPath from 1 to rep, where rep represents the number of $PM_2$ values that were compared to PM values in the sort algorithm of FIG. 9. The merge algorithm proceeds through each entry in the sorted list, and reorders the list to return the list to a strictly descending order. For the case of the low latency sort of FIG. 10A, a comparable process is illustrated in step 1024.

Dynamic List Size and Shared Variables

In some embodiments, a polar decoder is configured to dynamically adjust the list size between phases. For example, even though the decoder may support processing up to L paths in parallel, it may dynamically determine to execute less than L paths. This may reduce power consumption and/or improve performance, as discussed below.

In various situations, paths may converge quickly such that a relatively small number of paths can be used to finish decoding of an input bit vector. This may reduce power consumption by allowing unused PEs to be put into a low power state or assigned to other tasks, such as those associated with decoding other code blocks. In some embodiments, a decoder is configured to dynamically adjust the list size based on one or more of signal to noise ratio (SNR), sorting results, and/or channel LLR. In other embodiments, the decision to dynamically adjust the list size may be based on any of various appropriate parameters, in addition to and/or in place of the parameters discussed herein. The disclosed techniques may be used in mobile devices and in base stations. Dynamically changing list size may be particularly effective in base stations, where channel conditions may vary widely for different users. Therefore, the base station may be configured to use different list sizes for different users whose received data is being decoded at the same time.

In some embodiments, the decoder is configured to dynamically increase or decrease the list size based on SNR. For example, the decoder may decrease the list size when SNR is above a particular threshold. When SNR is high, a smaller number of parallel paths may reduce power consumption without adversely affecting decoding performance.

In some embodiments, the decoder is configured to dynamically increase or decrease the list size based on sorting results. As the list of viable paths begins to converge, the same paths may remain high ranking for multiple phases. Based on detecting this situation, the decoder may decrease the list size by eliminating other paths. For example, after N phases in which M paths have remained in a set of T top-ranked paths (where M and T are integers and T is greater than or equal to M), the decoder may reduce the list size to retain only top-ranked paths.

In some embodiments, the decoder is configured to determine the list size based on channel LLR (e.g., as input from a de-mapper). This may involve computing the number N of channel LLR values whose absolute value is less than a threshold. The list size L then may be determined based on N, e.g., using N/block_size. In some embodiments, the list is then trimmed or expanded based on convergence (or lack thereof) of path metrics.

The techniques discussed above may also be combined and the list size may be determined based on multiple parameters. Reducing the list size may reduce power consumption without significant reduction in performance.

Figure 14:
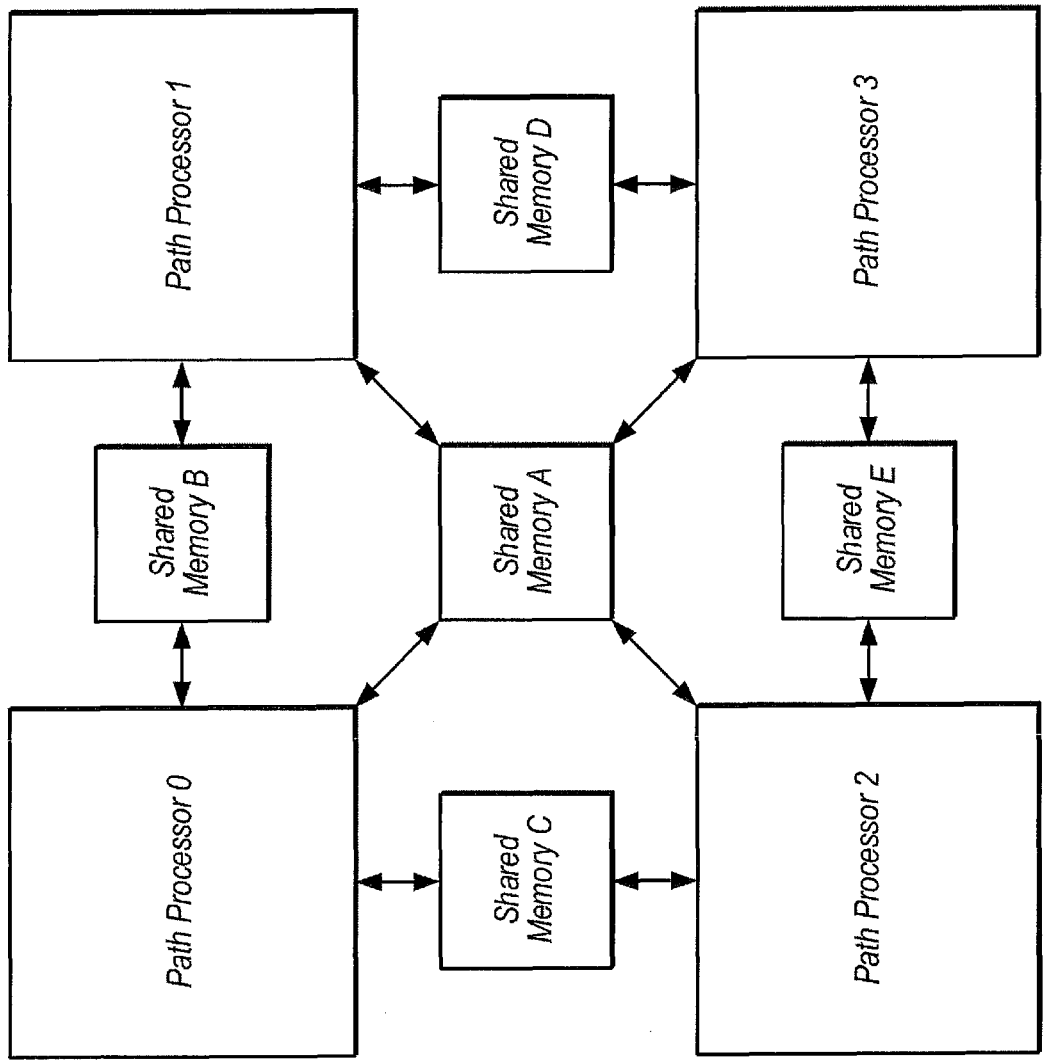
FIG. 14 illustrates a multi-processor array configured to implement a decoder with shared memory, according to some embodiments.

Further, small list sizes may allow for further optimizations to reduce power consumption and decoding time in some embodiments. FIG. 14 is a block diagram illustrating an exemplary decoder portion in a multi-processor array, according to some embodiments. Each "path processor" in the illustrated embodiment includes circuitry configured to process one path, which may include multiple PEs and DMRs, for example. In the illustrated embodiment, Shared memories A-E allow for quick access to shared variables between any two or more processors of path processors 0-3. The shared memories may be included in DMRs, in some embodiments. In some embodiments, each path processor is configured to write its polar code phase results to a shared memory concurrently with writing results to internal memory. In some embodiments, this preemptive writing may eliminate latency involved with data transfers between phases and may allow updateLLR to proceed immediately using shared memory for input as soon as new path assignments are made. Eliminating data transfer latency may reduce overall decoding time, in some embodiments. These techniques are somewhat similar to deferred update techniques discussed above except that the preemptive write occurs before the fact as an input to the next updateLLR instance, as opposed to sending the data via a message at the end of the preceding in-place updateLLR calculation.

Speaking generally, when the list size is reduced such that there are one or more shared memories accessible to each pair of path processors with sufficient buffer space for data shared to be potentially shared between those processors, shared variables may be used for all transmissions between phases, instead of routing data. This illustrates another advantage of dynamically adjusting the list size.

In some embodiments, selective update techniques are used to reduce the size of buffers needed in each shared memory.

The maximum number of paths for which data routing can be eliminated when using shared variables may depend on the availability of shared memory resources. For example, if shared memory A were eliminated, this number of path processors would be 2 in the illustrated embodiment, because path processors 0 and 3 and 1 and 2 would not have a shared memory that both could access. In the illustrated embodiment that includes shared memory A, however, this number of path processors is 4. This would be true even if shared memories B-E were eliminated, in the illustrated embodiment, assuming shared memory A includes sufficient buffer space for shared variables between all sets of path processors. In other embodiments, even larger groups of path processors may be sufficiently interconnected to use shared variables exclusively for transferring data between phases.

HyperX architectures may provide various tools for dynamically deciding when to use shared variables verses other data routing techniques such as message passing, DMA transfers, etc. These tools may be used to assign communications mechanisms between path processors (which may be dynamically set up between each decoding phase). Shared variables may be allocated in various locations in an MPA. In some embodiments, shared variables may be used to pre-emptively write bit estimate information even when shared variables are not located in shared memories that are physical adjacent to both relevant processors. This may still be efficient relative to non-preemptive writes because it may avoid waiting for the write later on. In embodiments and situations in which shared variables are allocated in shared memories that are immediately accessible to relevant path processors, data transfer latency may be effectively eliminated.

In some embodiments, shared variables may be used even when some other types of data routing are also used. For example, if path processor 0 and path processor 2 need to exchange data, this can be performed using shared variables while path processor 0 may also be configured to exchange data with other path processors (not shown, with which it does not share a memory) using other routing techniques. Therefore, in some embodiments the router is configured to dynamically determine whether to use shared variables or other routing techniques for data transfers at each decode phase. As discussed above, shared variables that are not located in shared memories may also be used, in some embodiments.

In some embodiments, the decoder is configured to schedule data transfers in a hierarchical fashion. For example, preemptive writes may be performed to shared memories for each group of N processors (e.g., 2, 4, etc.). The shared memory may be central to each group of path processors. Based on path assignments, data may then be transferred using shared variables within each group, before scheduling other types of data routing between groups.

In some embodiments, each group of processors that can all communicate with each other using shared variables may be assigned to a decoder as a cell. In embodiments in which an apparatus is executing multiple decoders, when the list size for one decoder is reduced this may free up cells which may then be assigned to another decoder. Assigning processing resources to decoders at the cell granularity may allow efficient allocation of processing resources to decoders which may significantly reduce power consumption, in various embodiments.

Embodiments of the present disclosure may be realized in any of various forms. For example, in some embodiments, the present invention may be realized as a computer-implemented method, a computer-readable memory medium, or a computer system. In other embodiments, the present invention may be realized using one or more custom-designed hardware devices such as ASICs. In other embodiments, the present invention may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computing device may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

Other embodiments may be implemented according to the following paragraphs:

A method for decoding encoded data received on a channel, wherein said decoding comprises:
  receiving the encoded data from the channel;
  decoding the encoded data by repeatedly:
    performing decoding operations and generating bit statistics on a plurality of bit paths, wherein each bit path is a potential decode of a portion of the encoded communication data;
    sorting a list of the plurality of bit paths generated by the processing elements based on the bit statistics, in order to determine a new subset of the list of bit paths;
    wherein said sorting comprises
      sorting a first list of the plurality of bit paths corresponding to likely additional bit values and a second list of the plurality of bit paths corresponding to unlikely additional bit values in different orders; and
      comparing at least a portion of the sorted list of first new bit paths with at least a portion of the sorted list of second new bit paths;
      creating the new subset of the list of bit paths by replacing one or more bit paths in the sorted list of first new bit paths with one or more bit paths from the sorted list of second new bit paths in response to the comparing.

A method for decoding encoded data received on a channel, wherein said decoding comprises:
  receiving the encoded data from the channel;
  decoding the encoded data by repeatedly:
    performing decoding operations and generating bit statistics on a plurality of bit paths, wherein each bit path is a potential decode of a portion of the encoded communication data;
    sorting a list of the plurality of bit paths generated by the processing elements based on the bit statistics, in order to determine a subset of the list of bit paths to be abandoned;

wherein said sorting comprises
for each respective bit path in the list of bit paths:
creating a first new bit path with an associated first path metric, wherein the first new bit path comprises the respective bit path with a likely value added as an additional bit; and
creating a second new bit path with an associated second path metric, wherein the second new bit path comprises the respective bit path with an unlikely value added as an additional bit, wherein the second path metric represents a lesser likelihood of accurate decoding than the first path metric;
sorting the list of first new bit paths in a first order; and
sorting the list of second new bit paths in a second different order;
comparing at least a portion of the sorted list of first new bit paths and at least a portion of the sorted list of second new bit paths; and
replacing one or more bit paths in the sorted list of first new bit paths with one or more bit paths from the sorted list of second new bit paths in response to the comparing.

A method for decoding encoded data received on a channel, wherein said decoding comprises:
receiving the encoded data from the channel;
decoding the encoded data by repeatedly:
performing decoding operations and generating bit statistics on a plurality of bit paths, wherein each bit path is a potential decode of a portion of the encoded communication data;
sorting a list of the plurality of bit paths generated by the processing elements based on the bit statistics, in order to determine a subset of the list of bit paths to be abandoned;
wherein said sorting comprises
for each respective bit path in the list of bit paths:
calculating a bit statistic associated with an additional bit to be added to the respective bit path, wherein the bit statistic indicates a likely value for the additional bit;
creating a first new bit path that comprises the respective bit path with the likely value added as the additional bit;
creating a second new bit path that comprises the respective bit path with the unlikely value added as the additional bit;
setting a path metric for the first new bit path equal to a path metric associated with the respective bit path;
setting a path metric for the second new bit path equal to the path metric associated with the respective bit path plus the absolute value of the respective bit statistic;
sorting the list of first new bit paths in descending order; and
sorting the list of second new bit paths in ascending order;
comparing at least a portion of the sorted list of first new bit paths and at least a portion of the sorted list of second new bit paths based on the path metrics of the first new bit path and the second new bit path;
replacing one or more bit paths in the sorted list of first new bit paths with one or more bit paths from the sorted list of second new bit paths in response to the comparing.

A system for performing successive cancellation list (SCL) decoding on received encoded communication data, the system comprising:
a plurality of processing elements; and
a plurality of memories coupled to adjacent processing elements of the plurality of processing elements;
wherein the system is configured to decode the received encoded communication data by:
by each of the processing elements:
receive a bit path from a memory, wherein the bit path is a potential decode of a portion of the encoded communication data;
perform decoding operations on the bit path; and
generate bit statistics for the bit path based at least in part on the decoding operations;
wherein the bit paths received at each processing element collectively comprise a first list of bit paths;
wherein the bit statistics generated at each processing element collectively comprise first bit statistics;
wherein the system is further configured to:
sort the first list of bit paths based on the first bit statistics;
determine to abandon a subset of the first list of bit paths based on the sorting of the first list of paths; and
by each respective processing element associated with a bit path that was determined not to be abandoned:
generate two lengthened bit paths;
copy, from a first memory associated with the respective processing element, to a second memory associated with a processing element associated with a second bit path that was determined to be abandoned, one of the lengthened bit paths and bit statistics generated by the respective processing element.

What is claimed is:
1. A system for performing successive cancellation list (SCL) decoding on received encoded communication data, the system comprising:
a plurality of processing elements; and
a plurality of memories interspersed among the plurality of processing elements and coupled to adjacent processing elements;
wherein the system is configured to decode the received encoded communication data by:
by each of the processing elements, perform decoding operations and generate bit statistics on a respective bit path, wherein the respective bit path is a potential decode of a portion of the encoded communication data;
sort a list of the respective bit paths generated by the processing elements based on the bit statistics, in order to determine a subset of the list of bit paths to be abandoned;
for at least a subset of respective processing elements having non-abandoned bit paths:
generate two lengthened bit paths;
copy, from a first memory associated with the respective processing element, to a second memory associated with a processing element associated with a second bit path that was determined to be abandoned, one of the lengthened bit paths and bit statistics generated by the respective processing element, wherein said copying comprises only copying bits and/or bit statistics in the lengthened bit path that are different from corresponding bits and/or bit statistics in the second bit path.

2. The system of claim 1,
wherein said sorting comprises sorting two different subsets of the list, where each subset is no greater than half the size of the list.

3. The system of claim 1,
wherein said sorting comprises
sorting a first list of the plurality of bit paths corresponding to likely additional bit values and a second list of the plurality of bit paths corresponding to unlikely additional bit values in different orders; and
comparing at least a portion of the sorted list of first new bit paths with at least a portion of the sorted list of second new bit paths;
creating the new subset of the list of bit paths by replacing one or more bit paths in the sorted list of first new bit paths with one or more bit paths from the sorted list of second new bit paths in response to the comparing.

4. The system of claim 1,
wherein decoding the encoded communication data produces decoded data; and
wherein the system is further configured to store the decoded data in a memory, wherein the decoded data is a selected one of the bit paths.

5. The system of claim 1,
wherein at least one of the processing elements is designated as a master processing element, and wherein the memories comprise a routing fabric interconnecting the plurality of processing elements;
wherein said copying comprises creating dynamic routes in the routing fabric to accomplish said copying;
wherein the system is further configured to:
communicate, by the master processing element, instructions for creating dynamic routes to each other processing element.

6. A system for performing successive cancellation list (SCL) decoding on received encoded communication data, the system comprising:
a plurality of processing elements; and
a plurality of memories interspersed among the plurality of processing elements and coupled to adjacent processing elements;
wherein the system is configured to decode the received encoded communication data by:
by each of the processing elements, perform decoding operations and generate bit statistics on a respective bit path, wherein the respective bit path is a potential decode of a portion of the encoded communication data;
sort a list of the respective bit paths generated by the processing elements, based on the bit statistics, in order to determine a subset of the list of bit paths to be abandoned;
for at least a subset of respective processing elements having non-abandoned bit paths:
generate two lengthened bit paths;
perform decoding operations and generate updated bit statistics on the two lengthened bit paths;
copy, from a first memory associated with the respective processing element, to a second memory associated with a processing element associated with a second bit path that was determined to be abandoned, one of the lengthened bit paths and updated bit statistics generated by the respective processing element.

7. The system of claim 6,
wherein the memories comprise a routing fabric interconnecting the plurality of processing elements;
wherein said copying comprises creating dynamic routes in the routing fabric to accomplish said copying.

8. The system of claim 6,
wherein at least one of the processing elements is designated as a master processing element;
wherein the system is further configured to:
communicate, by the master processing element, instructions for creating dynamic routes to each other processing element.

9. The system of claim 6,
wherein said sorting comprises
sorting a first list of the plurality of bit paths corresponding to likely additional bit values and a second list of the plurality of bit paths corresponding to unlikely additional bit values in different orders; and
comparing at least a portion of the sorted list of first new bit paths with at least a portion of the sorted list of second new bit paths;
creating the new subset of the list of bit paths by replacing one or more bit paths in the sorted list of first new bit paths with one or more bit paths from the sorted list of second new bit paths in response to the comparing.

10. A method for performing successive cancellation list (SCL) decoding on received encoded communication data, the method comprising:
receiving the encoded communication data from a channel;
decoding the encoded communication data, by repetitively:
performing, by a plurality of processing elements comprised within a processor, decoding operations, wherein each processing element performs decoding operations on a respective bit path in a first list of bit paths, wherein each bit path is a potential decode of a portion of the encoded communication data, wherein the performing decoding operations comprises generating first bit statistics associated with bits in the bit paths;
sorting the first list of bit paths based on the first bit statistics;
determining to abandon a subset of the first list of bit paths based on the sorting of the first list of paths;
generating, from each bit path that was determined not to be abandoned, two lengthened bit paths, wherein the lengthened bit paths comprise a second list of bit paths; and
for each respective processing element associated with a bit path that was determined not to be abandoned:
copying, from a first memory associated with the respective processing element, to a second memory associated with a processing element associated with a second bit path that was determined to be abandoned, one of the lengthened bit paths and bit statistics associated with the respective processing element.

11. The method of claim 10, wherein said copying one of the lengthened bit paths and bit statistics comprises only copying bits and bit statistics in the lengthened bit path that are different from corresponding bits and bit statistics in the second bit path.

12. The method of claim 10, the method further comprising:

by each processing element associated with a bit path that was determined to not be abandoned:
prior to said copying:
performing decoding operations on the two lengthened bit paths;
generating second bit statistics for each of the two lengthened bit paths based at least in part on the decoding operations on each lengthened bit path;
performing said copying additionally for at least a subset of the second bit statistics.

13. The method of claim 10,
wherein said sorting comprises:
sorting a first list of the plurality of bit paths corresponding to likely additional bit values and a second list of the plurality of bit paths corresponding to unlikely additional bit values in different orders; and
comparing at least a portion of the sorted list of first new bit paths with at least a portion of the sorted list of second new bit paths;
creating the new subset of the list of bit paths by replacing one or more bit paths in the sorted list of first new bit paths with one or more bit paths from the sorted list of second new bit paths in response to the comparing.

14. The method of claim 10,
wherein said decoding the encoded communication data is performed a plurality of times for successively larger bit paths until a bit path is reached that is above a predetermined threshold.

15. The method of claim 10, wherein half of the bit paths are determined to be abandoned.

16. The method of claim 10,
wherein decoding the encoded communication data produces decoded data; and
wherein the method further comprises storing the decoded data in a memory, wherein the decoded data is a selected one of the bit paths.

17. The method of claim 10,
wherein the processor further comprises a routing fabric interconnecting the plurality of processing elements;
wherein said copying comprises creating dynamic routes in the routing fabric to accomplish said copying.

18. The method of claim 10,
wherein at least one of the processing elements in the processor is designated as a master processing element;
wherein the method further comprises:
communicating, by the master processing element, instructions for creating dynamic routes to each other processing element.

19. A non-transitory computer readable memory medium comprising program instructions for performing successive cancellation list (SCL) decoding on received encoded communication data, wherein the program instructions are executable to:
receive the encoded communication data from a channel;
decode the encoded communication data, by repetitively:
performing, by processing element coupled to the memory medium, decoding operations, wherein the processing element performs decoding operations on a bit path, wherein the bit path is a potential decode of a portion of the encoded communication data, wherein the performing decoding operations comprises generating first bit statistics associated with bits in the bit path;
receiving notification to not abandon the bit path;
receiving notification that a second memory medium is associated with a bit path that will be abandoned;
generating two lengthened bit paths;
copying, to the second memory medium, one of the lengthened bit paths and at least a subset of the first bit statistics.

20. The non-transitory computer readable memory medium of claim 19, wherein said copying one of the lengthened bit paths and bit statistics comprises only copying bits and bit statistics in the lengthened bit path that are different from corresponding bits and bit statistics in the abandoned bit path.

21. The non-transitory computer readable memory medium of claim 19, wherein the program instructions are further executable to:
prior to said copying:
performing decoding operations on the two lengthened bit paths; and
generating second bit statistics for each of the two lengthened bit paths based at least in part on the decoding operations on each lengthened bit path;
performing said copying additionally for at least a subset of the second bit statistics.

22. The non-transitory computer readable memory medium of claim 19, wherein decoding the encoded communication data further comprises:
receiving notification to abandon the bit path;
receive, from a third memory medium, a lengthened bit path and bit statistics associated with the lengthened bit path.

* * * * *